(12) United States Patent
Lin

(10) Patent No.: US 12,199,202 B2
(45) Date of Patent: Jan. 14, 2025

(54) HYBRID PASSIVATION BACK CONTACT CELL AND FABRICATION METHOD THEREOF

(71) Applicant: Golden Solar (Quanzhou) New Energy Technology Co., Ltd., Quanzhou (CN)

(72) Inventor: Kairui Lin, Quanzhou (CN)

(73) Assignee: Golden Solar (Quanzhou) New Energy Technology Co., Ltd., Quanzhou (CN)

( * ) Notice: Subject to any disclaimer, the term of this patent is extended or adjusted under 35 U.S.C. 154(b) by 0 days.

(21) Appl. No.: 18/120,595

(22) Filed: Mar. 13, 2023

(65) Prior Publication Data

US 2024/0097060 A1   Mar. 21, 2024

(30) Foreign Application Priority Data

Sep. 16, 2022   (CN) .......................... 202211125435.X

(51) Int. Cl.

| | | |
|---|---|---|
| *H01L 31/0224* | (2006.01) | |
| *H01L 31/0216* | (2014.01) | |
| *H01L 31/0236* | (2006.01) | |
| *H01L 31/028* | (2006.01) | |
| *H01L 31/0368* | (2006.01) | |

(Continued)

(52) U.S. Cl.
CPC ............ *H01L 31/022441* (2013.01); *H01L 31/02168* (2013.01); *H01L 31/02366* (2013.01); *H01L 31/028* (2013.01); *H01L 31/03685* (2013.01); *H01L 31/03762* (2013.01); *H01L 31/077* (2013.01); *H01L 31/1824* (2013.01)

(58) Field of Classification Search
None
See application file for complete search history.

(56) References Cited

U.S. PATENT DOCUMENTS

2014/0096821 A1*   4/2014   Chen ................... H01L 31/0352
                                                              438/96
2014/0295613 A1   10/2014   O'Sullivan

FOREIGN PATENT DOCUMENTS

| CN | 108922938 A | 11/2018 |
|---|---|---|
| CN | 110034193 A | 7/2019 |

(Continued)

OTHER PUBLICATIONS

Machine translation of CN114038922A (Year: 2022).*

(Continued)

*Primary Examiner* — Tamir Ayad
(74) *Attorney, Agent, or Firm* — Erise IP, P.A.

(57) ABSTRACT

The present disclosure pertains to the field of back contact cell technologies, and particularly relates to a hybrid passivation back contact cell and a fabrication method thereof, the hybrid passivation back contact cell including: an N-type doped silicon substrate having a light receiving surface and a back surface, and a first semiconductor layer and a second semiconductor layer which are arranged on the back surface, wherein the second semiconductor layer includes an intrinsic silicon layer and a P-type doped silicon layer sequentially arranged in an outward direction perpendicular to the back surface, and the first semiconductor layer includes a tunneling oxide layer and an N-type doped silicon crystal layer sequentially arranged in the outward direction perpendicular to the back surface.

16 Claims, 10 Drawing Sheets

(51) Int. Cl.
*H01L 31/0376* (2006.01)
*H01L 31/077* (2012.01)
*H01L 31/18* (2006.01)

(56) References Cited

FOREIGN PATENT DOCUMENTS

| | | |
|---|---|---|
| CN | 110634961 A | 12/2019 |
| CN | 110957391 A | 4/2020 |
| CN | 210778636 U | 6/2020 |
| CN | 111799348 A | 10/2020 |
| CN | 111816727 A | 10/2020 |
| CN | 114038922 A | 2/2022 |
| CN | 114068731 A | 2/2022 |
| CN | 114823967 A | 7/2022 |
| KR | 1020140022507 | 2/2014 |
| WO | 2014056268 | 4/2014 |
| WO | 2014056268 A1 | 4/2014 |
| WO | 2019237561 A1 | 12/2019 |

OTHER PUBLICATIONS

Machine translation of CN114823967A (Year: 2022).*
Chinese Patent Application No. 202211125435.X Search Report Dated Oct. 21, 2022.
Chinese Patent Application No. 202211125435.X Supplemental Search Report Dated Nov. 14, 2022.
Chinese Patent Application No. 202211125435.X First Office Action dated Oct. 26, 2022.
Chinese Patent Application No. 202211125435.X Second Office Action issued Nov. 18, 2022.
Chinese Patent Application 202211125435X Notification to Grant Patent Right for Invention of Priority Application issued Jan. 11, 2023.
European Patent Application 23161487.6 Examination Report issued Sep. 5, 2023.
Australian Patent Application 2023201492 Examination Report issued Feb. 22, 2024.
European Patent Application 23161487.6 Search Report issued Aug. 24, 2023.

* cited by examiner

HYBRID PASSIVATION BACK CONTACT CELL AND FABRICATION METHOD THEREOF

RELATED APPLICATION

The present disclosure claims priority of Chinese patent application with the filing number 202211125435X filed on Sep. 16, 2022 with the Chinese Patent Office, and entitled "HYBRID PASSIVATION BACK CONTACT CELL AND FABRICATION METHOD THEREOF", the contents of which are incorporated herein by reference in entirety.

TECHNICAL FIELD

The present disclosure pertains to the field of back contact cell technologies, and particularly relates to a hybrid passivation back contact cell and a fabrication method thereof.

BACKGROUND ART

Sanyo applied for a heterojunction (HIT) photovoltaic cell technology in 1994, which is characterized in that technological manufacture is simple and only has steps of texturing, cleaning, CVD film coating, ITO film coating, silver paste printing, or the like. Compared with other currently dominant photovoltaic manufacturing technologies characterized by high-temperature diffusion, the heterojunction technology has features of a low surface recombination rate, a high open circuit voltage, or the like, but is sensitive to surface damage from chemical contamination or mechanical scratch. A back contact cell has no optical obscuration of a conventional cell and is structurally characterized by complete transfer of electrodes to a back surface of the cell. Due to unique advantages of a back contact technology in terms of a power generation efficiency and appearance, the Panasonic heterojunction department successively invests in a development of the heterojunction low-temperature back contact technology from 2014, but so far, an opening technology for back electrode is mainly ink printing and chemical etching, and room of cost reduction is relatively limited, such that obstacles exist in mass production and large-scale commercialization so far. Meanwhile, a process route adopting a back contact technical route is more complex, and frequent cell surface contact damages surface passivation, which does not facilitate a reduction of a production cost of the cell on the one hand and an improvement of a mass production efficiency on the other hand. It is estimated that the absolute efficiency of the cell is reduced by 0.2% for each additional printing process. Therefore, the key of mass production and large-scale commercialization of the contact technology is a reduction of production steps, so as to reduce efficiency reduction caused by mechanical contact.

Laser processing for a cell surface belongs to a non-contact mode, and can reduce an efficiency reduction of the cell caused by a processing technology. Currently, laser has been applied in other types of cell production, including a back metal contact opening of PERC, a selective emitter of TOPCON, and a back electrode opening of IBC, and these processes realize sufficient industrial progress. However, a low-temperature process is generally adopted in the traditional heterojunction technology, and disadvantages of high-temperature intolerance and mechanical-wear intolerance of the heterojunction technology limit a development of a heterojunction back contact cell (HBC), and particularly limit introduction of a laser technology with a cost advantage. Since an amorphous silicon thin film is sensitive to a thermal effect introduced by laser processing, configuration of the laser in the heterojunction back contact technical route is required to be independently researched and optimized.

CN114068731A is a previous research result of the applicant, and provides a back contact heterojunction solar cell featuring low laser damage and a fabrication method thereof. By arranging a laser absorption sacrificial layer, laser is absorbed to reduce damage of the laser to a first semiconductor layer, but all thin-film layers have pinhole defects, and cause electric leakage. Since an adopted photovoltaic device is still constructed based on the traditional HIT technology, the laser thermal effect still influences a performance of the amorphous silicon thin film, such that the advantage of photoelectric conversion efficiency of the heterojunction structure cannot be more sufficiently exerted.

TOPCON is a high-efficiency passivation technology similar to the heterojunction technology and is characterized in that high-quality silicon oxide is used as a tunneling oxide layer, polycrystalline silicon in contact therewith is subjected to phosphorus doping to form an N electrode for collecting electrons, and polycrystalline silicon in contact therewith is subjected to boron doping to form a P electrode for collecting holes. SUNPOWER in USA invented the first commercialized IBC cell technology, and a tunneling-oxide-layer passivation technology was formally introduced into mass production in 2009. This technology was then academically promoted by Fraunhofer in Europe, a conversion efficiency higher than 26.0% is realized in a small size device, and this technology was formally named the POLO or TOPCON technology. In the TOPCON technology, a related passivation film layer is obtained by processing with a high-temperature technology, is insensitive to downstream thermal damage, and can greatly reduce complexity of an engineering design.

In a word, since the heterojunction technology is a low-temperature process (lower than 200° C.), the grown film layer is sensitive to the thermal effect of the laser, and resistance to chemical corrosion is not strong. In addition, a plurality of complex physical or chemical methods are required to be combined for openings, which causes common pinhole defects, such that an actual filling factor FF and the photoelectric conversion efficiency are low, and yield is low.

SUMMARY

An object of the present disclosure is to provide a hybrid passivation back contact cell and a fabrication method thereof, so as to overcome defects of a low actual filling factor FF, photoelectric conversion efficiency and yield and a complex process of a traditional heterojunction back contact cell in a prior art. Compared with a conventional heterojunction cell, the hybrid passivation back contact cell can obviously improve the filling factor FF, the photoelectric conversion efficiency, the yield, or the like, and the fabrication method is relatively simple, can be industrialized and is beneficial to an improvement of a mass production efficiency.

In order to achieve the above object, in a first aspect, the present disclosure provides a hybrid passivation back contact cell, including: an N-type doped silicon substrate having a light receiving surface and a back surface, and a first semiconductor layer and a second semiconductor layer which are arranged on the back surface, wherein the second semiconductor layer includes an intrinsic silicon layer and a P-type doped silicon layer sequentially arranged in an outward direction perpendicular to the back surface, and the first semiconductor layer includes a tunneling oxide layer and an N-type doped silicon crystal layer sequentially arranged in the outward direction perpendicular to the back surface.

In some preferred embodiments, the intrinsic silicon layer and the tunneling oxide layer have a thickness ratio of 1.2-11:1, preferably 1.5-5:1.

In some more preferred embodiments, the tunneling oxide layer, the N-type doped silicon crystal layer, the intrinsic silicon layer, and the P-type doped silicon layer have a thickness ratio of 1:11-300:1.2-11:3-50, preferably 1:20-100:1.5-5:4-20.

In some preferred embodiments, a ratio of a surface doping index of the N-type doped silicon crystal layer to a surface doping index of the P-type doped silicon layer is 0.07-40:1, preferably 0.07-20:1, more preferably 0.07-5:1, still more preferably 0.07-1:1; and the surface doping index is a ratio of an effective doping concentration of the corresponding doped layer to the thickness of the doped layer.

In some preferred embodiments, the intrinsic silicon layer is made of intrinsic amorphous silicon, the P-type doped silicon layer is made of P-type doped amorphous silicon or P-type doped microcrystalline silicon, and the N-type doped silicon crystal layer is made of N-type doped polycrystalline silicon.

In some embodiments, the P-type doped silicon layer includes an incubation layer, a P-type oxygen-containing microcrystalline layer and a P-type oxygen-free microcrystalline layer, and the P-type oxygen-containing microcrystalline layer and the P-type oxygen-free microcrystalline layer have a thickness ratio of 1:0.25-7.

In some preferred embodiments, the P-type doped silicon layer is made of P-type doped amorphous silicon.

In some preferred embodiments, the N-type doped silicon substrate is made of Czochralski single crystals or ingot single crystals.

In some preferred embodiments, the light receiving surface of the N-type doped silicon substrate is a textured surface, and the back surface is a polished surface.

In some preferred embodiments, the hybrid passivation back contact cell further includes:
- a dielectric insulation film, provided on a surface of the first semiconductor layer, wherein the first semiconductor layer and the dielectric insulation film provided thereon are arranged at intervals along a direction parallel to the back surface as a whole, the second semiconductor layer is provided on a surface of the dielectric insulation film and covers a surface of the intervals, and an opening for exposing the first semiconductor layer is formed in the second semiconductor layer between adjacent intervals;
- a transparent conductive film, provided on a surface of the second semiconductor layer and a surface of the first semiconductor layer exposed at the opening, wherein an insulation groove for exposing the second semiconductor layer is formed on the transparent conductive film between the adjacent interval and opening; and
- a passivation film layer, a doped film layer and an anti-reflective film layer, which are arranged on a surface of the light receiving surface and sequentially arranged along an outward direction perpendicular to the light receiving surface.

More preferably, the passivation film layer is made of intrinsic amorphous silicon; the doped film layer is an N-type amorphous film layer or an N-type oxygen-containing microcrystalline film layer; the anti-reflective film layer is made of at least one of silicon nitride, silicon dioxide, silicon oxide and silicon oxynitride.

In a second aspect, the present disclosure provides a fabrication method of the hybrid passivation back contact cell of the first aspect, including:
- S101: providing an N-type doped silicon substrate;
- S102: sequentially plating a first semiconductor layer and a dielectric insulation film on a back surface of the N-type doped silicon substrate, wherein the first semiconductor layer includes a tunneling oxide layer and an N-type doped silicon crystal layer;
- S103: etching holes at intervals on the back surface of the N-type doped silicon substrate obtained in S102, so as to remove the first semiconductor layer on the back surface and the dielectric insulation film on the first semiconductor layer at intervals, and then cleaning to obtain the first semiconductor layer and the dielectric insulation film which are arranged at intervals;
- S104: forming a second semiconductor layer in a full cover mode on the back surface of the N-type doped silicon substrate obtained in S103, wherein the second semiconductor layer includes an intrinsic silicon layer and a P-type doped silicon layer; a second conductive region is formed at the holes and the second semiconductor layer provided thereon;
- S105: etching an opening on the back surface of the N-type doped silicon substrate obtained in S104, so as to expose the first semiconductor layer on a part of the second semiconductor layer between adjacent intervals, and then cleaning to form a first conductive region, wherein the first conductive region and the second conductive region are alternately arranged;
- S106: depositing a transparent conductive film on the back surface of the N-type doped silicon substrate obtained in S105; etching an insulation groove on the transparent conductive film between the opening and the corresponding hole; forming a first electrode on a surface of the hole and forming a second electrode on a surface of the opening; and
- S107: sequentially forming a passivation film layer, a doped film layer and an anti-reflective film layer on a light receiving surface of the N-type doped silicon substrate.

In some preferred embodiments, the etching is performed by laser ablation in conjunction with optional chemical etching, the first semiconductor layer, the second semiconductor layer and the transparent conductive film are removed by laser ablation, and the dielectric insulation film is removed by laser ablation or chemical etching.

In some more preferred embodiments, in S103, the removal of the first semiconductor layer in the etching of the hole is performed in a first laser ablation mode in which continuously scanning light spots are partially overlapped, and a laser absorption amount $D_1$ of the to-be-removed first semiconductor layer is more than 70% of a total absorption amount of all film layers.

Further preferably, condition for the first laser ablation is as follows: pulse laser is adopted, and a pulse width is less than 20 nanoseconds; the light spot formed on the back surface by the laser is circular, elliptical or rectangular; the laser is spatially shaped into square, circular or elliptical flat-top laser.

In some more preferred embodiments, in S105, the removal of the second semiconductor layer in the etching of the opening is performed in a discontinuous-hole-formation or continuous-hole-formation second laser ablation mode. When the discontinuous-hole-formation mode is adopted, the formed light spots are not overlapped, and a laser absorption amount $D_2$ of the to-be-removed second semiconductor layer is more than 70%, preferably more than 80%, of the total absorption amount of all the film layers; and when the continuous-hole-formation mode is adopted, the formed light spots are partially overlapped, the second semiconductor layer on a top is removed by first laser exposure ablation of the adjacent light spots, and at this point, a laser absorption amount $D_{201}$ required for removing the corresponding layer is more than 70% of the total absorption amount of all the film layers; and second laser exposure ablation caused by the overlap of part of the light spots removes the underlying dielectric insulation film and part of the top N-type doped silicon crystal layer at the bottom, and at this point, a laser absorption amount $D_{202}$ required for removing the corresponding layer is more than 50% of the total absorption amount of all the film layers.

Further preferably, condition for the second laser ablation is as follows: pulse laser is adopted, and a pulse width is less than 20 nanoseconds; the light spot formed on the back surface by the laser is circular, elliptical or rectangular; the laser is spatially shaped into rectangular, circular or elliptical flat-top laser.

In some more preferred embodiments, in S106, the insulation groove is etched in a third laser ablation mode in which the continuously scanning light spots are partially overlapped, and a laser absorption amount $D_3$ of the to-be-etched transparent conductive film and the second semiconductor layer overlapped therewith is more than 70%, preferably more than 85%, of the total absorption amount of all the film layers.

Further preferably, condition for the third laser ablation is as follows: pulse laser is adopted, and a pulse width is less than 100 nanoseconds; the light spot formed on the back surface by the laser is circular, elliptical or rectangular.

As described in the Background Art, the inventor of the present disclosure finds that laser etching is a feasible solution for mass production of the heterojunction back contact cell technology, and can greatly simplify the technological process of the back contact technology. However, the traditional heterojunction back contact cell is unstable when laser is adopted, and the heterojunction thin film mainly made of amorphous silicon may be significantly changed at a temperature over 220° C.; for example, hydrogen atoms will greatly overflow after laser processing of intrinsic amorphous silicon and N-type amorphous/microcrystalline silicon, which leads to a reduction of minority carrier lifetime; to avoid this thermal degradation, a complex engineering design is required; and the yield is low, process fabrication is complicated, and mass production with a lower cost and obtaining of a finished product with a high photoelectric conversion efficiency cannot be realized.

Although high temperature laser can be adopted in the TOPCON process, conductivity is good, and a passivation level matched with heterojunction passivation may be reached, a practical passivation level is lower than that of the heterojunction, and particularly, an electrode region of a second semiconductor responsible for passivation is a bottleneck for restricting an electrical property, and an open circuit voltage is about 710-730mv, which is lower than typical 745mv of the heterojunction. A photoelectric conversion performance is still lower than that of the traditional heterojunction cell.

Apparatuses adopted by the traditional heterojunction passivation process and the TOPCON process belong to two different apparatus systems, and the two processes are generally independently researched and improved in the prior art. In the present disclosure, the traditional heterojunction passivation structure and a TOPCON structure are innovatively combined for the first time to form the hybrid passivation back contact cell, the tunneling oxide layer and the N-type doped silicon crystal layer (TOPCON passivation film layer) are used as the first semiconductor layer, and the traditional heterojunction passivation film layer is used as the second semiconductor layer; that is, the TOPCON and the heterojunction are organically combined to realize hybrid passivation, and the TOPCON passivation film layer with a high-temperature manufacturing process is used for replacing the conventional heterojunction passivation film layer; and research shows that a process window can be expanded by adopting the back contact cell structure with the above structure, and compared with the conventional heterojunction cell, the yield and the final conversion efficiency are improved, and meanwhile, a conversion efficiency of the filling factor FF can be obviously improved (more than 3% in some specific examples).

In the preferred fabrication method according to the present disclosure, the first semiconductor layer with a specific structure is resistant to a high temperature (800-870° C.), and the first semiconductor layer fabricated by high temperature laser ablation can allow the subsequent fabrication process, such as the formation process for the opening of the second semiconductor layer or the insulation groove, or the like, to have a broader process window, such that the whole fabrication process of the back surface and the laser processing technology have a better matching, each opening or hole, or the like, on the back surface can be formed using the laser ablation mode, and thus the stability is good; mass production can be realized, the fabrication method is simpler, the yield is higher, the material cost is lower, and optical exposure, etching, photoresist apply and removal, or the like, in the fabrication method for traditional heterojunction back contact cell are avoided.

BRIEF DESCRIPTION OF DRAWINGS

To describe the technical solutions in the embodiments of the present disclosure more clearly, the following briefly describes the accompanying drawings required in the embodiments. It should be understood that the following accompanying drawings show merely some embodiments of the present disclosure and therefore should not be considered as limiting the scope, and a person of ordinary skill in the art may still derive other related drawings from these accompanying drawings without creative efforts.

FIG. 4b is a flow chart of a subsequent fabrication process of FIG. 4a;

REFERENCE NUMERALS

Figure 1A:
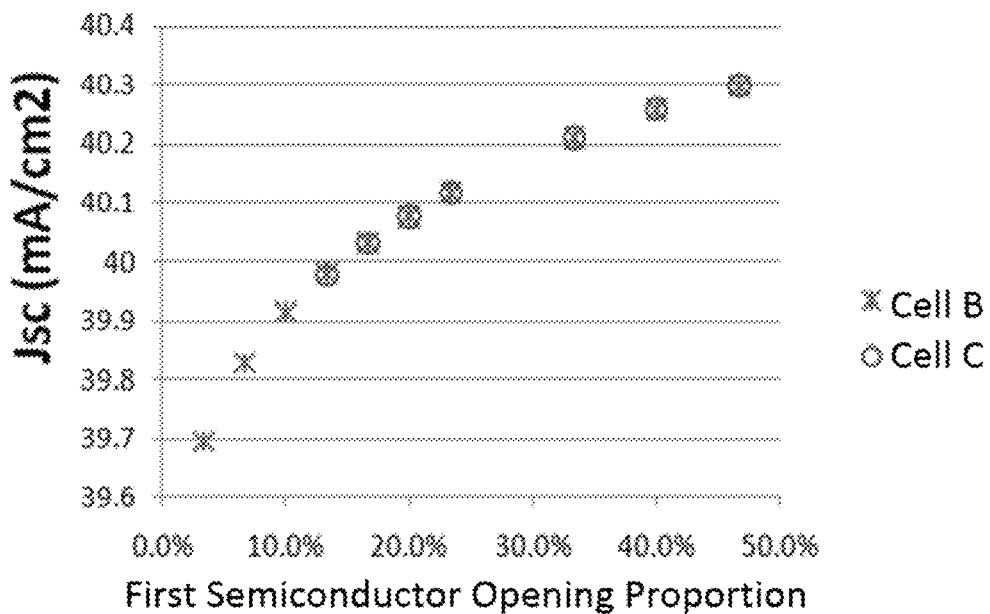
FIG. 1a is a comparative diagram of a theoretically predicted electrical performance JSC of a conventional heterojunction back contact cell B and a hybrid passivation back contact cell C according to the present disclosure.
Figure 1B:
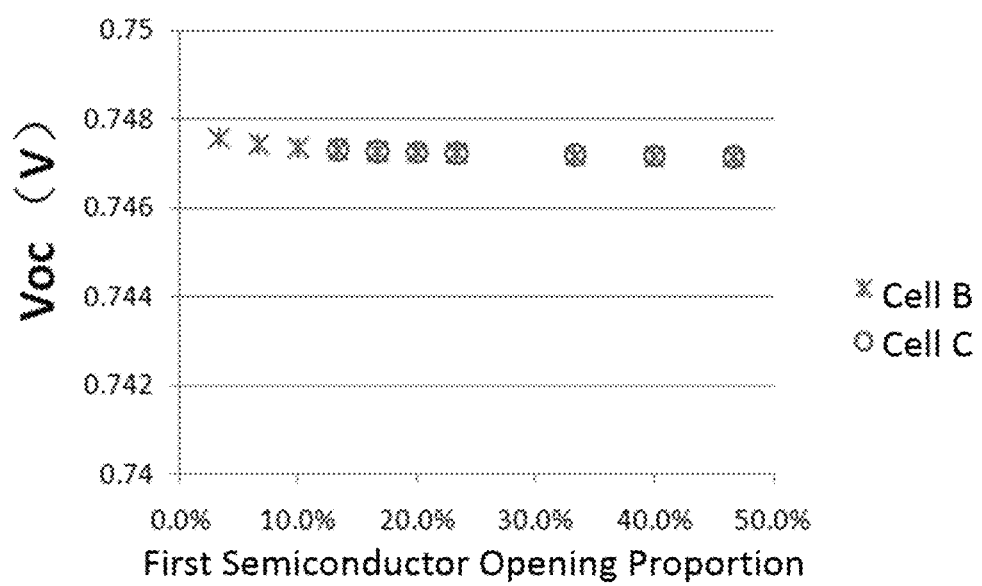
FIG. 1b is a comparative diagram of a theoretically predicted electrical performance Voc of the conventional heterojunction back contact cell B and the hybrid passivation back contact cell C according to the present disclosure.
Figure 1C:
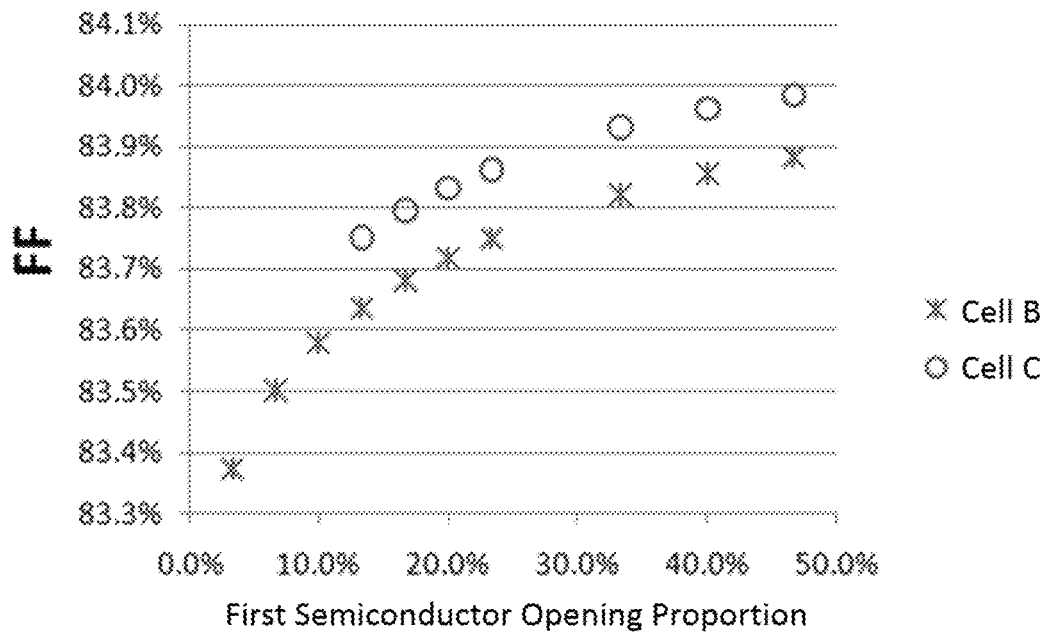
FIG. 1c is a comparative diagram of a theoretically predicted electrical performance filling factor FF of the conventional heterojunction back contact cell B and the hybrid passivation back contact cell C according to the present disclosure.
Figure 1D:
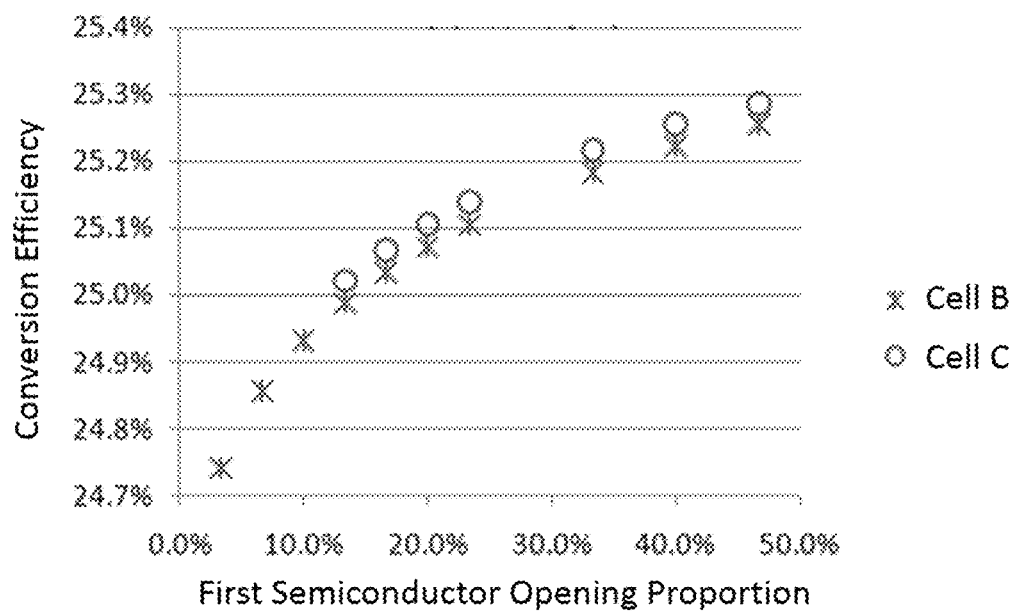
FIG. 1d is a comparative diagram of a theoretically predicted electrical performance conversion efficiency of the conventional heterojunction back contact cell B and the hybrid passivation back contact cell C according to the present disclosure.

00: N-type doped silicon substrate, 01: back surface, 02: light receiving surface, 10: sacrificial layer, 11: tunneling oxide layer, 12: N-type doped silicon crystal layer, 13: dielectric insulation film, 14: hole, 21: intrinsic silicon layer, 22: P-type doped silicon layer, 23: opening, 30: transparent conductive film, 31: insulation groove, 41: passivation film layer, 42: doped film layer, 43: anti-reflective film layer, 51: fine grid line, 52: main grid line.

DETAILED DESCRIPTION OF EMBODIMENTS

Endpoints and any value of ranges disclosed herein are not limited to the precise ranges or values, and these ranges or values should be understood to encompass values close to these ranges or values. For numerical ranges, endpoint values of the ranges can be combined with each other, endpoint values of the ranges and individual point values can be combined with each other, and individual point values can be combined with each other, so as to obtain one or more new numerical ranges, and such numerical ranges should be construed as specifically disclosed herein.

Traditionally, in a back contact cell, etching is performed on a back surface using a mask to form a P-type electrode and an N-type electrode, and finally, an interdigitated electrode structure is formed. Unlike IBC or TBC characterized by high temperature diffusion, HBC characterized by a heterojunction passivation layer is sensitive to surface contact and mechanical damage, and especially, a first semiconductor layer which is first fabricated undergoes multiple high temperature heat treatments including a laser process, and chemical cleaning and etching steps. In the present disclosure, a TOPCON passivation film layer with a high-temperature fabricating process replaces the conventional heterojunction passivation film layer to serve as the first semiconductor layer, thus expanding a process window, and improving yield and a final conversion efficiency.

Specifically, in a first aspect, the present disclosure provides a hybrid passivation back contact cell, including: an N-type doped silicon substrate having a light receiving surface and a back surface, and a first semiconductor layer and a second semiconductor layer which are arranged on the back surface, wherein the second semiconductor layer includes an intrinsic silicon layer and a P-type doped silicon layer sequentially arranged in an outward direction perpendicular to the back surface, and the first semiconductor layer includes a tunneling oxide layer and an N-type doped silicon crystal layer sequentially arranged in the outward direction perpendicular to the back surface.

It may be understood that a junction between the second semiconductor layer and the N-type doped silicon substrate is a heterojunction.

FIGS. 1a, 1b, 1c and 1d show relevant theoretically predicted photoelectric conversion performances of a conventional heterojunction back contact cell and a hybrid passivation back contact cell according to the present disclosure. As can be seen from the drawings, both a filling factor FF and a photoelectric conversion efficiency of the hybrid passivation back contact cell are improved, and the filling factor is significantly improved. FIGS. 1a, 1b, 1c, and 1d show theoretical simulation values, the improvement of the filling factor FF is an improvement of conductivity of the first semiconductor layer due to introduction of a TOPCON technology. In comparison of actual experimental electrical properties, the FF improvement is more significant due to a laser opening eliminating a possibility of power leakage by pinhole.

In some preferred embodiments, the intrinsic silicon layer and the tunneling oxide layer have a thickness ratio of 1.2-11:1, preferably 1.5-5:1. In the preferred solution of the present disclosure, compared with the intrinsic silicon layer, the tunneling oxide layer has the appropriate thickness, which is more beneficial to an improvement of the electrical conversion efficiency of the back contact cell; presumably, the reason for this is that the tunneling oxide layer with a relatively suitable thickness provides fewer interface defects, an impurity energy level is annihilated in high temperature anneal, and a conduction mechanism thereof is quantum tunneling or accidentally occurring pinhole defects. In a traditional heterojunction cell structure, a layer of hydrogenated amorphous silicon provides main passivation, and also has certain conductivity, and electrons or holes are transited through band gap impurity energy levels in the layer of amorphous silicon.

In some more preferred embodiments, the tunneling oxide layer, the N-type doped silicon crystal layer, the intrinsic silicon layer, and the P-type doped silicon layer have a thickness ratio of 1: 11-300:1.2-11:3-50, preferably 1:20-100:1.5-5:4-20. The preferred solution of the present disclosure is more beneficial to an improvement of the FF of the back contact cell, and presumably, the reason for this may be that, due to introduction of the TOPCON first semiconductor layer of the present disclosure, carriers may be transversely conducted (due to a hundreds-of-time conductivity improvement) and then vertically collected, a design of an opening ratio has a greater degree of freedom, and a migration rate of an introduced high temperature polycrystal may reach 200-300; the high-temperature polycrystal in the present disclosure can arbitrarily increase a thickness of a film layer, and the conductivity and FF of the whole back contact cell are obviously improved. An amorphous carrier migration rate of the traditional heterojunction is low (taking electrons as an example, the migration rate is approximately 0.5-1), and the migration rate of microcrystalline silicon is slightly improved and is about 10; and the FF of the cell is likely to be reduced when a thickness of a traditional amorphous silicon thin film is increased.

In some preferred embodiments, a ratio of a surface doping index of the N-type doped silicon crystal layer to a surface doping index of the P-type doped silicon layer is 0.07-40:1, preferably 0.07-20:1, more preferably 0.07-5:1, still more preferably 0.07-1:1; the surface doping index is a ratio of an effective doping concentration of the corresponding doped layer to the thickness of the doped layer. The preferred solution of the present disclosure is more beneficial to an improvement of the overall electrical conversion efficiency of the back contact cell, and presumably, the reason for this may be that the N-type doped silicon crystal layer with a relatively appropriate surface doping index introduced in the first semiconductor layer in the present disclosure enables the high temperature polycrystal to ensure that limited doping and nominal doping are almost completely consistent; that is, all elemental phosphorus is activated. In the traditional amorphous silicon film layer, especially a B-doped P-type amorphous thin film, activated B in the film layer is little and is only 5-7% of activated B in nominal doping, and the rest is reflected as defects of the film layer.

On the basis of satisfying the thickness ratio and/or the surface doping index ratio in the first semiconductor layer and the second semiconductor layer in the present disclosure, those skilled in the art can select a thickness and an effective doping concentration of each layer according to actual requirements.

Exemplarily, in some embodiments, the tunneling oxide layer has a thickness of 10-22 angstroms, preferably 15-20 angstroms. The preferred solution can guarantee a balance between optimal passivation and conductivity, and meanwhile, the process is simple and controllable, and the reason is that a thickness saturation value of a natural intrinsic silicon oxide layer (native oxide) is 15-20 angstroms, and the thickness will not be uncontrollably increased.

Exemplarily, in some embodiments, the N-type doped silicon crystal layer has a thickness of 30-250 nm and an effective doping concentration greater than $5e18$ $cm^{-3}$. More preferably, the N-type doped silicon crystal layer has a thickness of 150-200 nm and an effective doping concentration of $1e19$-$8e19$ $cm^{-3}$. Under the preferred solution of the present disclosure, the transverse conductivity of a first semiconductor is greatly enhanced, natural or design fluctuation caused by an insufficient carrier mean free path and low conductivity of a transparent conductive film can be eliminated, and maximization of the FF is ensured. A sheet resistance of the N-type doped silicon crystal layer can be selected by those skilled in the art according to requirements, and for example, the sheet resistance can be 30-200Ω/□, preferably 40-70Ω/□.

Exemplarily, in some embodiments, the intrinsic silicon layer has a thickness of 3-10 nm; the P-type doped silicon layer has a thickness of 7-45 nm and an effective doping concentration of $2e18$-$1e20$ $cm^{-3}$. The preferred solution of the present disclosure can guarantee the vertical conductivity of a device, and meanwhile, a short circuit of the device will not be caused when a weaker P-type second semiconductor and the extremely strong conductivity are lapped.

The thickness of the N-type doped silicon substrate in the present disclosure can be selected by those skilled in the art according to requirements, and the thickness is preferably 110-150 microns. Under the preferred solution of the present disclosure, a highest power generation efficiency can be achieved, and meanwhile, a silicon material is used most economically and feasibly.

In the present disclosure, the intrinsic silicon layer in the second semiconductor layer is a hydrogenated intrinsic amorphous silicon thin film (traditional heterojunction film layer).

In some embodiments, the P-type doped silicon layer is made of P-type doped amorphous silicon. The solution belongs to the traditional heterojunction technology and has an advantage of a low cost.

In some embodiments, the P-type doped silicon layer is made of P-type doped microcrystalline silicon, which is costly, does not provide significant benefits in back contact, and is difficult to destroy by etching with HF acid.

In some embodiments, the P-type doped silicon layer includes an incubation layer, a P-type oxygen-containing microcrystalline layer and a P-type oxygen-free microcrystalline layer, and the P-type oxygen-containing microcrystalline layer and the P-type oxygen-free microcrystalline layer have a thickness ratio of 1:0.25-7. Under the preferred solution, the P-type oxygen-containing microcrystalline layer and the P-type oxygen-free microcrystalline layer with a proper thickness ratio are more beneficial to an improvement of the open circuit voltage Voc, the filling factor FF and the conversion efficiency Eta of the cell; presumably, the reason for this is that the oxygen-containing microcrystalline layer has low conductivity, and the suitable film thickness is equivalent to the Debye length, such that an improvement of the electrical property can be sufficiently realized, and gradual transition is required for the oxygen-free microcrystalline layer to perform a chemical protection function on the oxygen-containing microcrystalline layer.

Those skilled in the art can select the thickness of the incubation layer according to practical requirements, which does not require creative efforts; exemplarily, the thickness ratio of the P-type oxygen-containing microcrystalline layer and the incubation layer is 1:0.1-20.

In some embodiments, the N-type doped silicon crystal layer is made of N-type doped polycrystalline silicon. The N-type doped polycrystalline silicon can be directly formed polycrystalline silicon, or is formed by microcrystalline silicon and an amorphous silicon film layer through high temperature modification, and the high temperature modification process at least includes one or more process steps at a temperature more than 600° C.

The tunneling oxide layer in the present disclosure is preferably made of tunneling silicon oxide.

In some preferred embodiments, the N-type doped silicon substrate is made of Czochralski single crystals or ingot single crystals.

In some preferred embodiments, the light receiving surface of the N-type doped silicon substrate is a textured surface, and the back surface is a polished surface. This preferred solution can satisfy requirements of back laser processing consistency, such that a laser processing surface has a polished structure, instead of a traditional textured light trapping structure.

The hybrid passivation back contact cell according to the present disclosure may further include other conventional components in the art, such as an insulation layer partially provided between the first semiconductor layer and the second semiconductor layer, a conductive layer provided above the second semiconductor layer, a metalized pattern formed on the back surface, such as fine grid lines, main grid lines, and welding pads, a passivation layer provided on the light receiving surface, or the like.

In some preferred embodiments, the hybrid passivation back contact cell further includes:

a dielectric insulation film, provided on a surface of the first semiconductor layer, wherein the first semiconductor layer and the dielectric insulation film provided thereon are arranged at intervals along a direction parallel to the back surface as a whole, the second semiconductor layer is provided on a surface of the dielectric insulation film and covers a surface of the intervals, and an opening for exposing the first semiconductor layer is formed in the second semiconductor layer between adjacent intervals; and a transparent conductive film, provided on a surface of the second semiconductor layer and a surface of the first semiconductor layer exposed at the opening, wherein an insulation groove for exposing the second semiconductor layer is formed on the transparent conductive film between the adjacent interval and opening. Under this preferred solution, the arrangement of the dielectric insulation film between the first semiconductor layer and the second semiconductor layer can prevent electric leakage of the device, and the opening and the insulation groove required by the back contact cell are arranged, which can avoid the electric short circuit between the first semiconductor layer and the second semiconductor layer, avoid damage caused by mechanical contact, and meanwhile can avoid the pinhole defect of a dielectric insulation film, and improve the power generation conversion efficiency of the cell. The integral arrangement of the openings and the insulation grooves may be set by those skilled in the art according to requirements, for example, by adjusting the overlapping degree of light spots or the size of the light spots.

It may be understood that, in the above preferred embodiment, the back surface is formed by a region including direct contact between the second semiconductor and the N-type doped silicon substrate, a region including direct contact between the first semiconductor and the N-type doped silicon substrate, and a transition region therebetween; and in an outward direction perpendicular to the N-type doped silicon substrate, the transition region includes the first semiconductor layer, the dielectric insulation film and the second semiconductor layer which are sequentially distributed. The transparent conductive film on the back surface is also included in each region, and the transparent conductive film is not included in the insulation groove.

In the present disclosure, it may be understood that the hybrid passivation back contact cell further includes two electrodes formed over the first semiconductor layer and the second semiconductor layer. In some more preferred embodiments, the hybrid passivation back contact cell further includes: a first grid line provided over the second semiconductor layer at a surface at the interval to form a first metal electrode; and a second grid line provided over the first semiconductor layer at the opening to form a second metal electrode.

In some more preferred embodiments, the hybrid passivation back contact cell further includes: a passivation film layer, a doped film layer and an anti-reflective film layer which are arranged on a surface of the light receiving surface and sequentially arranged along an outward direction perpendicular to the light receiving surface.

In the above preferred embodiment, it may be understood that the second semiconductor layer substantially entirely covers the dielectric insulation film with the intervals on the back surface (a covering region includes a bottom and a side surface of the interval), and the openings are provided only between the adjacent intervals.

Composition, thicknesses, or the like, of the dielectric insulation film and the transparent conductive film, and the thicknesses of the passivation film layer, the doped film layer and the anti-reflective film layer can be selected by those skilled in the art according to actual requirements, which does not require creative efforts, and is not repeated herein.

In some specific embodiments, the passivation film layer is made of intrinsic amorphous silicon; the doped film layer is an N-type amorphous film layer or an N-type oxygen-containing microcrystalline film layer, preferably an N-type oxygen-containing microcrystalline film layer; the anti-reflective film layer is made of at least one of silicon nitride, silicon dioxide, silicon oxide and silicon oxynitride. This embodiment is more beneficial to an improvement of transmittance of sunlight.

Area proportions of the formed insulation grooves, the formed openings and the formed holes on the corresponding film layers can be selected by those skilled in the art according to actual requirements. The proportions or ratios of the insulation groove, the opening and the hole are measured by area in the present disclosure.

In a second aspect, the present disclosure provides a fabrication method of the hybrid passivation back contact cell of the first aspect, including:

S101: providing an N-type doped silicon substrate;

S102: sequentially plating a first semiconductor layer and a dielectric insulation film on a back surface of the N-type doped silicon substrate, wherein the first semiconductor layer includes a tunneling oxide layer and an N-type doped silicon crystal layer;

S103: etching holes at intervals on the back surface of the N-type doped silicon substrate obtained in S102, so as to remove the first semiconductor layer on the back surface and the dielectric insulation film on the first semiconductor layer at intervals, and then cleaning to obtain the first semiconductor layer and the dielectric insulation film which are arranged at intervals;

S104: forming a second semiconductor layer in a full cover mode on the back surface of the N-type doped silicon substrate obtained in S103, wherein the second semiconductor layer includes an intrinsic silicon layer and a P-type doped silicon layer; a second conductive region is formed at the holes and the second semiconductor layer provided thereon; it may be understood that the second semiconductor layer at the opening is in direct contact with the N-type doped silicon substrate;

S105: etching an opening on the back surface of the N-type doped silicon substrate obtained in S104, so as to expose the first semiconductor layer on a part of the second semiconductor layer between adjacent intervals, and then cleaning to form first conductive regions, wherein the first conductive regions and the second conductive regions are alternately arranged;

S106: depositing a transparent conductive film on the back surface of the N-type doped silicon substrate obtained in S105; etching an insulation groove on the transparent conductive film between the opening and the hole; forming a first electrode on a surface of the hole and forming a second electrode on a surface of the opening; and S107: sequentially forming a passivation film layer, a doped film layer and an anti-reflective film layer on a light receiving surface of the N-type doped silicon substrate.

In the present disclosure, the second semiconductor layer can be formed by adopting a PECVD or Hot-wire method, the first semiconductor layer can be formed by adopting a PECVD or Hot-wire method, and the passivation film layer, the doped film layer and the anti-reflective film layer can be formed by adopting a PECVD or Hot-wire method.

S101 further includes: chemically cleaning the N-type doped silicon substrate, wherein alkali liquor can be adopted for the chemical cleaning, for example.

In some specific embodiments, the process of S101 includes: cutting the Czochralski single crystal or the ingot single crystal by a diamond wire or mortar to form a silicon wafer substrate with a thickness of 100-250 microns, optionally, pre-cleaning the silicon wafer by a tank solution to remove organic pollution and large particles on a surface, then performing damage removal and texturing by alkali liquor to form a roughened light trapping structure, performing RCA cleaning (or a solution formula equivalent to the RCA cleaning), and finally removing a surface oxidation layer by an HF solution, and performing deionized water cleaning and surface drying dehydration processes. Although a single crystal proportion of the ingot single crystal is higher, a polycrystalline grain boundary and a lattice defect with a larger proportion still exist in the cell; if the used substrate is an ingot monocrystalline silicon wafer, before the heterojunction production process is introduced, pretreatment at different temperature sections is required to achieve effects of impurity absorption and dangling bond saturation, which belong to mature existing technologies in the art and are not repeated herein.

In some specific embodiments, S101 further includes: allowing the N-type doped silicon substrate to have a structure with one textured surface and one polished surface. More preferably, the process includes: using a silicon nitride or silicon oxide film layer as a protective sacrificial layer on the light receiving surface, and keeping the textured light trapping structure of the light receiving surface of the substrate to realize back polishing, such that the light receiving surface of the N-type doped silicon substrate is the textured surface, and the back surface is the polished surface.

In some specific embodiments, the process of plating the first semiconductor layer in S102 may include: forming a tunneling oxide layer on the back surface of the N-type doped silicon substrate by adopting wet oxidation, dry oxidation or plasma oxidation; and fabricating a silicon film layer on a surface of the tunneling oxide layer by using a low-pressure chemical vapor deposition (LPCVD), plasma enhanced chemical vapor deposition (PECVD) or physical vapor deposition (PVD) method, and doping phosphorus (phosphorus doping can be realized in an in-situ doping mode or a high temperature phosphorus diffusion mode) on the polycrystalline film layer to form an N-type doped silicon crystal layer, so as to obtain the first semiconductor layer.

The tunneling oxide layer may be specifically formed by wet oxidation, including an ozone oxidation method, a nitric acid oxidation method, a hydrogen peroxide oxidation method, or the like. For example, oxygen, ozone, or hydrogen peroxide is introduced into a heated solution; and for example, the silicon wafer is soaked in a heated nitric acid solution. The tunneling oxide layer may also be formed by dry oxidation, including a thermal oxidation method, a PECVD in-situ oxidation method, or the like. For example, the silicon wafer is placed in a furnace tube type apparatus and heated to 500-700° C., oxygen or water vapor is introduced into the apparatus or water vapor adsorbed on a tube wall or a surface of the silicon wafer is utilized for oxidation, the thermal oxidation method is preferably adopted, and condition is as follows: a thermal oxidation temperature is 550-650° C., a gas source is oxygen, and an oxidation time is 10-30 min. The tunneling oxide layer may also be formed by plasma assisted oxidation.

In the formation of the N-type doped silicon crystal layer, the in-situ doping process may include, for example, introducing a phosphorus source (such as a phosphine gas) in a gas atmosphere for growing polycrystalline silicon, amorphous silicon or microcrystalline silicon; the high temperature phosphorus diffusion process may specifically include, for example, first growing a polycrystalline silicon, amorphous silicon, or microcrystalline silicon film layer (for example, the film layer may be fabricated by PECVD or obtained by PVD sputtering), performing high temperature annealing, and then forming effective diffusion of phosphorus in a diffusion furnace containing a phosphorus source (for example, a layer of PSG glass is first deposited on the surface); preferably, after a polycrystalline silicon, amorphous silicon or microcrystalline silicon film layer is deposited by LPCVD, diffusion is performed, a diffusion temperature is 830-880° C., a diffusion source is phosphorus oxychloride or oxygen, and a diffusion time is 80-180 min. All the processes are mature existing technologies in the art and will not be repeated herein.

The dielectric insulation film may be plated in S102 using a PECVD method.

In some specific embodiments, in S103, hole etching is performed by using a conventional photoetching mode, and the process may, for example, include: exposing and developing photoresist to form a protective pattern, then performing wet chemical etching on an unprotected region by the photoresist to form an opening region, and finally removing the photoresist.

In some other more preferred embodiments, the etching in the present disclosure is performed by laser ablation in conjunction with optional chemical etching (preferably wet chemical etching, such as chemical etching using a hydrofluoric acid-containing solution), the first semiconductor layer, the second semiconductor layer and the transparent conductive film are removed by laser ablation, and the dielectric insulation film is removed by laser ablation or chemical etching, without causing a perforation phenomenon to the dielectric insulation film.

In some specific preferred embodiments, in S103, the process of etching the hole includes: performing first laser ablation on the first semiconductor layer and the dielectric insulation film on the first semiconductor layer by using laser beams, and performing partial hole formation in conjunction with wet chemical etching to remove the first semiconductor layer on the back surface and the dielectric insulation film on the first semiconductor layer at intervals for exposing the N-type doped silicon substrate.

More preferably, in S103, the removal of the first semiconductor layer in the etching of the hole is performed in a first laser ablation mode in which continuously scanning light spots are partially overlapped, and a laser absorption amount $D_1$ of the to-be-removed first semiconductor layer is more than 70% of a total absorption amount of all film layers. In the preferred solution of the present disclosure, most laser energy can be absorbed by the to-be-removed first semiconductor layer, thus avoiding deep subfissure of the N-type doped silicon substrate; the reason is that a direct absorption depth of the film layer is related to a laser wavelength, a direct absorption depth of polycrystalline silicon caused by 532 nm laser is 100-200 nm, and a direct absorption depth of polycrystalline silicon irradiated by 355 nm laser is 10-20 nm, such that by concentrating most laser on the to-be-removed first semiconductor layer, the laser acting on the substrate is reduced, and the deep subfissure of the substrate is avoided.

The "total absorption amount of all the film layers" in the present disclosure refers to the total absorption amount of all the film layers of the substrate, the back surface thereof and the light receiving surface thereof at the present moment.

Figure 5A:
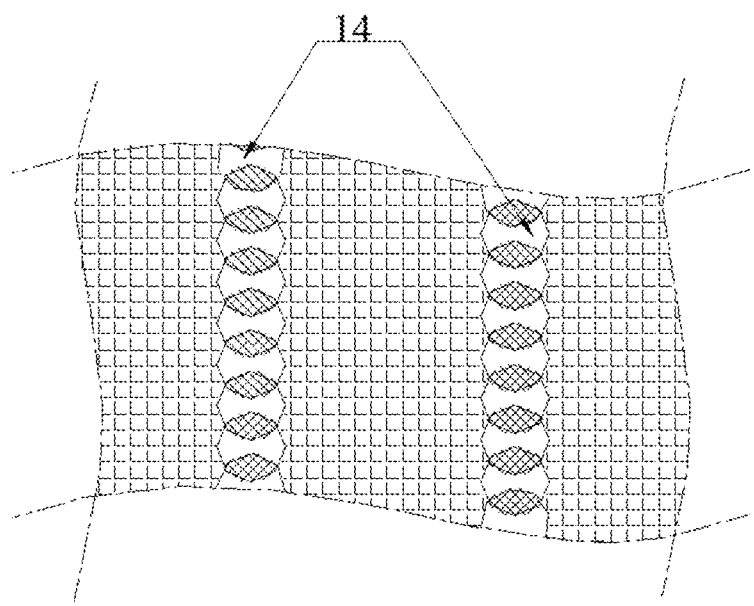
FIG. 5a shows a first nearly-circular laser beam spot scanning mode formed by etching holes on a back surface, in which adjacent light spots are partially overlapped and sub-adjacent light spots are not overlapped.
Figure 5B:
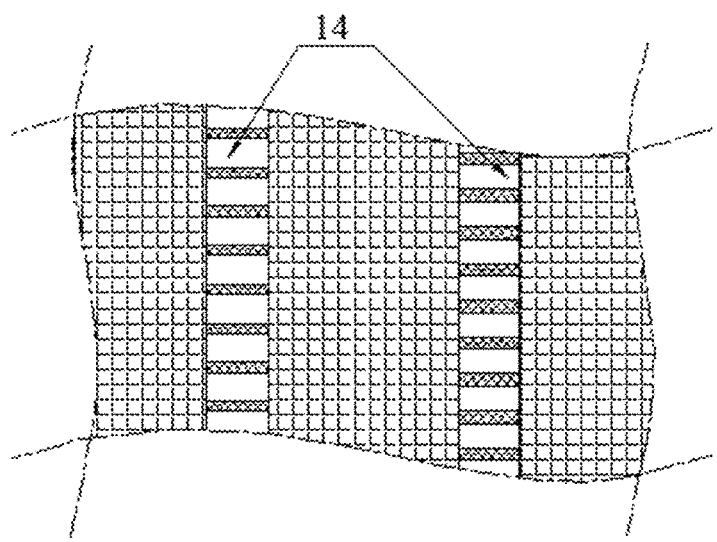
FIG. 5b shows a second nearly-square laser spot scanning mode formed by etching holes on a back surface, in which adjacent light spots are partially overlapped and sub-adjacent light spots are not overlapped.
Figure 5C:
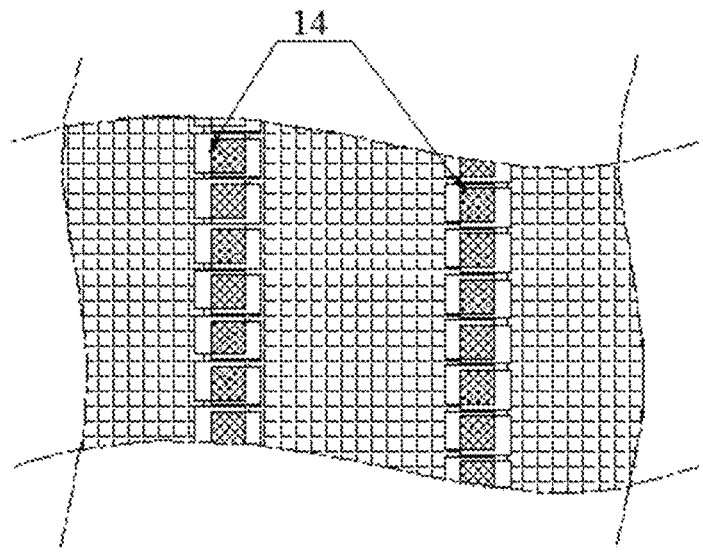
FIG. 5c shows a third nearly-square laser spot scanning mode formed by etching holes on a back surface, in which a first column of scanning light spots are not overlapped, a second column of retraced light spots are not overlapped back and forth in a moving track direction, but the first and second columns of light spots are partially overlapped.

Those skilled in the art can satisfy the above laser absorption amount and the above ratio by controlling the laser wavelength, pulse width, irradiation time, or the like. More preferably, condition for the first laser ablation is as follows: pulse laser is adopted, and a pulse width is less than 20 nanoseconds. More preferably, the used laser forms circular, elliptical or rectangular light spots on the back surface, which may be arranged in various partially overlapped ways, as shown in FIGS. 5a, 5b, and 5c. More preferably, the used laser is spatially shaped as flat-top laser, which is spatially distributed on a processed surface in a shape of a square, circle or oval flat top, preferably a rectangular shape. The laser wavelength can be about 355 nm or 532 nm. A used laser device may be, for example, a laser device with a wavelength of about 355 nm obtained by tripling frequency of a YAG laser device, or a laser device with a wavelength of about 532 nm obtained by doubling frequency of a YAG laser device.

Those skilled in the art can select laser with different wavelengths, such as ultraviolet light or green light, to perform the first laser ablation according to the thickness of the first semiconductor layer, remove a part of the first semiconductor layer, and meanwhile avoid excessive damage to the N-type doped silicon substrate. An absorption depth of polycrystalline silicon or crystalline silicon by laser with a wavelength of about 355 nm is 10-20 nm, and an absorption depth of polycrystalline silicon or crystalline silicon by laser with a wavelength of about 532 nm is 100-200 nm. Preferably, an ultraviolet pulsed light source with a wavelength of 355 nm is adopted for the first laser ablation. An absorption main body of the first laser ablation in the present disclosure is the first semiconductor layer, and an additional optical sacrificial layer of CN114068731A is not required for absorption, such that the fabrication method is simple, and mass production and industrialization can be realized.

In S104, the second semiconductor layer is formed by PECVD full-area coverage. A PECVD apparatus power source can have a frequency of 13.56 MHz, 26 MHz or 40 MHz.

It can be understood in the present disclosure that, in S104, the dielectric insulation film on the back surface subjected to partial hole formation is covered with the second semiconductor layer in a full-area coating manner; then, in S105, the second semiconductor layer on an upper layer is removed by laser hole formation, and then, the dielectric insulation film is removed by chemical etching to expose the first semiconductor layer on a bottom layer.

The intrinsic silicon layer and the P-type doped silicon layer in the second semiconductor layer can be formed by those skilled in the art by using an existing method; process gas for forming the intrinsic silicon layer may include, for example, all or a combination of several of silane (SiH4), H2, CO2, and CH4; process gas for forming the P-type doped silicon layer may include, for example, all or a combination of several of SiH4, H2, CO2, B2H6 (diborane), or TMB (trimethylboron).

In some specific embodiments, in S105, opening etching may be performed by using a conventional photoetching mode, and the process may, for example, include: exposing and developing photoresist to form a protective pattern, then performing wet chemical etching on an unprotected region by the photoresist to form an opening region, and finally removing the photoresist.

In some other more preferred embodiments, in S105, the process of etching the opening includes: removing the second semiconductor layer of a partial region of the back surface by using laser beams, carrying out second laser ablation, and etching the dielectric insulation film below the partial region in a chemical etching manner to obtain the opening exposing the first semiconductor layer below the opening, so as to form the first conductive regions, the first conductive regions and the second conductive regions being alternately arranged.

More preferably, in S105, the removal of the second semiconductor layer in the etching of the opening is performed in a discontinuous-hole-formation or continuous-hole-formation second laser ablation mode. The latter is preferred.

In one specific embodiment, when the discontinuous-hole-formation mode is adopted, the formed light spots are not overlapped, and a laser absorption amount $D_2$ of the to-be-removed second semiconductor layer is more than 70%, preferably more than 80%, of the total absorption amount of all the film layers. In this solution of the present disclosure, the to-be-removed second semiconductor layer can absorb most laser energy, an opening section has a clear boundary, and meanwhile, the bottom film layer and the substrate are slightly damaged or are completely free of damage. Under this solution, chemical etching may be applied to remove the exposed dielectric insulation film; or the second laser ablation is repeatedly applied to the original opening position to remove the exposed dielectric insulation film, and in this case, the laser absorption amount of the N-type doped polycrystalline layer during the second laser ablation is more than 50% of the total absorption amount of all the film layers.

The thickness and refractive index of the dielectric insulation film may be further optimized by those skilled in the art to provide an effect of interference superposition at a vertical spatial position where the second semiconductor layer is located.

In a more preferred embodiment, when the continuous-hole-formation mode is adopted, the formed light spots are partially overlapped, the second semiconductor layer on a top is removed by first laser exposure ablation of the adjacent light spots, and at this point, a laser absorption amount $D_{201}$ required for removing the corresponding layer is more than 70% of the total absorption amount of all the film layers; and second laser exposure ablation caused by the overlap of part of the light spots removes the underlying dielectric insulation film and part of the top N-type doped silicon crystal layer at the bottom, and at this point, a laser absorption amount $D_{202}$ required for removing the corresponding layer is more than 50% of the total absorption amount of all the film layers. Under the preferred solution, in the second laser ablation mode of continuous hole formation, two times of laser exposure ablation can be carried out; since the film layer structure in the present disclosure is resistant to a high temperature, the underlying dielectric insulation film and part of the top N-type doped silicon crystal layer at the bottom can be removed through second laser exposure ablation without chemical etching.

Figure 6A:
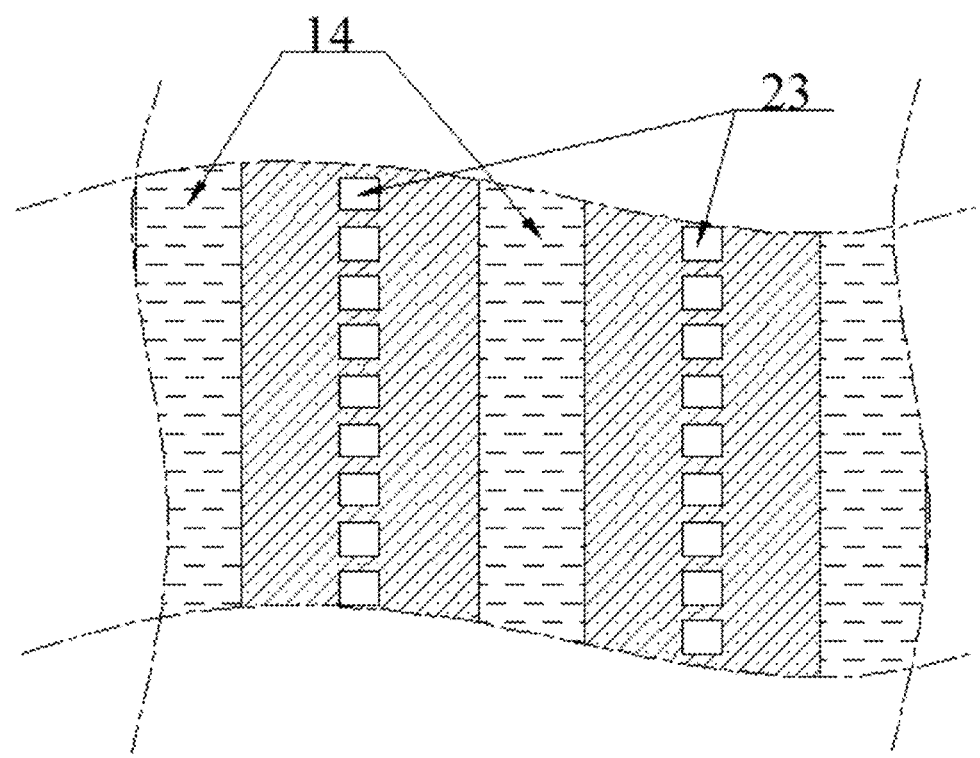
FIG. 6a shows a first single-column rectangular discontinuous laser beam spot scanning mode formed by etching openings on the back surface.
Figure 6B:
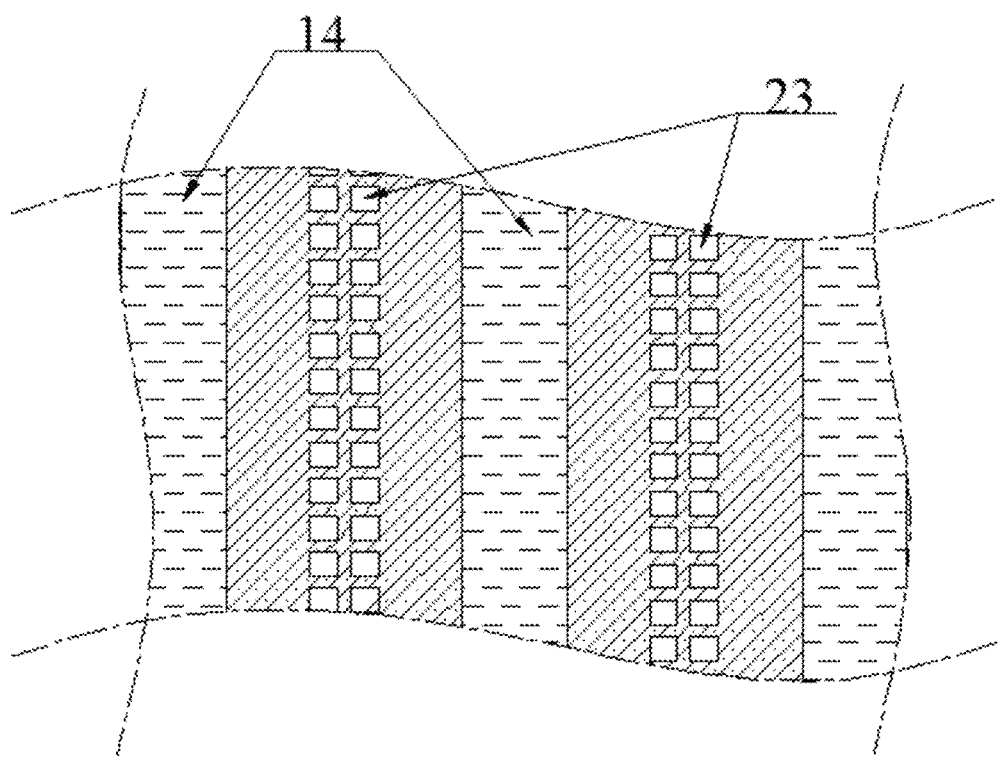
FIG. 6b shows a second double-column rectangular discontinuous laser beam spot scanning mode formed by etching openings on the back surface.

Those skilled in the art can satisfy the above laser absorption amount and the above ratio by controlling the laser wavelength, pulse width, irradiation time, or the like. More preferably, condition for the second laser ablation is as follows: pulse laser is adopted, and a pulse width is less than 20 nanoseconds, preferably less than 100 picoseconds. The laser wavelength can be about 355 nm or 532 nm. More preferably, green laser having a pulse width less than 100 picoseconds is used. More preferably, the used laser forms circular, oval or rectangular light spots on the back surface (as shown in FIGS. 6a and 6b), which may be in a single column or multiple columns, so as to avoid a reduction of a power generation efficiency caused by laser damage. More preferably, the used laser is spatially shaped into rectangular, circular or elliptical flat-top laser, preferably rectangular laser; that is, spatial distribution of the laser on the processed surface has a shape of a rectangle, circle or elliptical flat top, so as to ensure that energy in the processed region tends to be uniform. A used laser device is preferably a laser device with a wavelength of 355 nm obtained by tripling frequency of a YAG laser device, or a laser device with a wavelength of 532 nm obtained by doubling frequency of a YAG laser device.

In the preferred solution of the present disclosure, the first semiconductor layer is partially removed by adopting the first laser ablation, the second semiconductor layer is partially removed by adopting the second laser ablation, the function of the first semiconductor layer below the second semiconductor layer is not damaged, the insulation groove is constructed by adopting the third laser ablation, but the second semiconductor layer below the insulation groove is not damaged, such that stability is good, and yield is high.

In the present disclosure, the cleaning in S103 and S105 includes chemical cleaning and smoothing for a silicon surface of the exposed region, thus providing a low-defect interface for subsequent effective fabrication of a film layer. These processes are conventional technologies in the art and will not be repeated herein.

In S106, the transparent conductive film may be deposited by PVD full-area coverage. A target material and a doping material of PVD can be selected by those skilled in the art according to requirements. For example, the target material used in PVD may be pure indium oxide, and then, hydrogen or water vapor is introduced into the process gas to form a hydrogen doped indium oxide thin film.

In some specific embodiments, in S106, the etching of the insulation groove may be performed by using a conventional photoetching mode, and the process may, for example, include: exposing and developing photoresist to form a protective pattern, then performing wet chemical etching on an unprotected region by the photoresist to form an opening region, and finally removing the photoresist.

In some other more preferred embodiments, in S106, the process of etching the insulation groove includes: performing the third laser ablation by using laser beams, and removing part of the transparent conductive film between the first conductive region and the second conductive region, so as to form the insulation groove between two adjacent conductive regions. The insulation groove is provided to physically insulate the N electrode of the first conductive region from the P electrode of the second conductive region.

More preferably, in S106, the insulation groove is etched in a third laser ablation mode in which the continuously scanning light spots are partially overlapped, and a laser absorption amount $D_3$ of the to-be-etched transparent conductive film and the second semiconductor layer overlapped therewith is more than 70%, preferably more than 85%, of the total absorption amount of all the film layers. In a preferred solution of the present disclosure, a position with great optical interference is located in the second semiconductor or the transparent conductive film in contact with the second semiconductor, and the transparent conductive film to be etched can absorb most laser energy, so as to protect integrity of the underlying dielectric insulation film and the first semiconductor layer from being damaged. It may be understood that, under this solution, the total absorption amount of all the film layers includes the total absorption amount of the film layers of the substrate, the first semiconductor layer and the second semiconductor layer on the substrate, and the light receiving surface below the substrate.

Those skilled in the art can satisfy the above laser absorption amount and the above ratio by controlling the laser wavelength, pulse width, irradiation time, or the like. Further preferably, condition for the third laser ablation is as follows: pulse laser is adopted, and a pulse width is less than 100 nanoseconds. The laser wavelength may be about 355 nm. More preferably, the used laser forms circular, elliptical or rectangular light spots on the back surface.

The laser ablation in the present disclosure can be performed using ultraviolet laser, purple laser or green laser.

It may be understood that in S103 and S106 in the present disclosure, the continuously scanning light spots are partially overlapped, which means that adjacent light spots are overlapped in the formed light spots.

In some embodiments, the process of forming the first electrode or the second electrode in S106 includes: applying conductive silver paste on the back surface of the obtained N-type doped silicon substrate to form metalized patterns including the fine grid line, the main grid line perpendicular to the fine grid line and the welding pad, which is favorable for realization of effective electric contact. A method for applying the conductive silver paste can be a screen printing method or an ink-jet printing method.

The passivation film layer, the doped film layer and the anti-reflective film layer in S107 can be deposited using a PECVD method. The process gas for the passivation film layer may include, for example, all or a combination of several of SiH4, H2, CO2, and CH4.

The present disclosure will be described below in further detail in conjunction with specific examples.

Example 1

Figure 2:
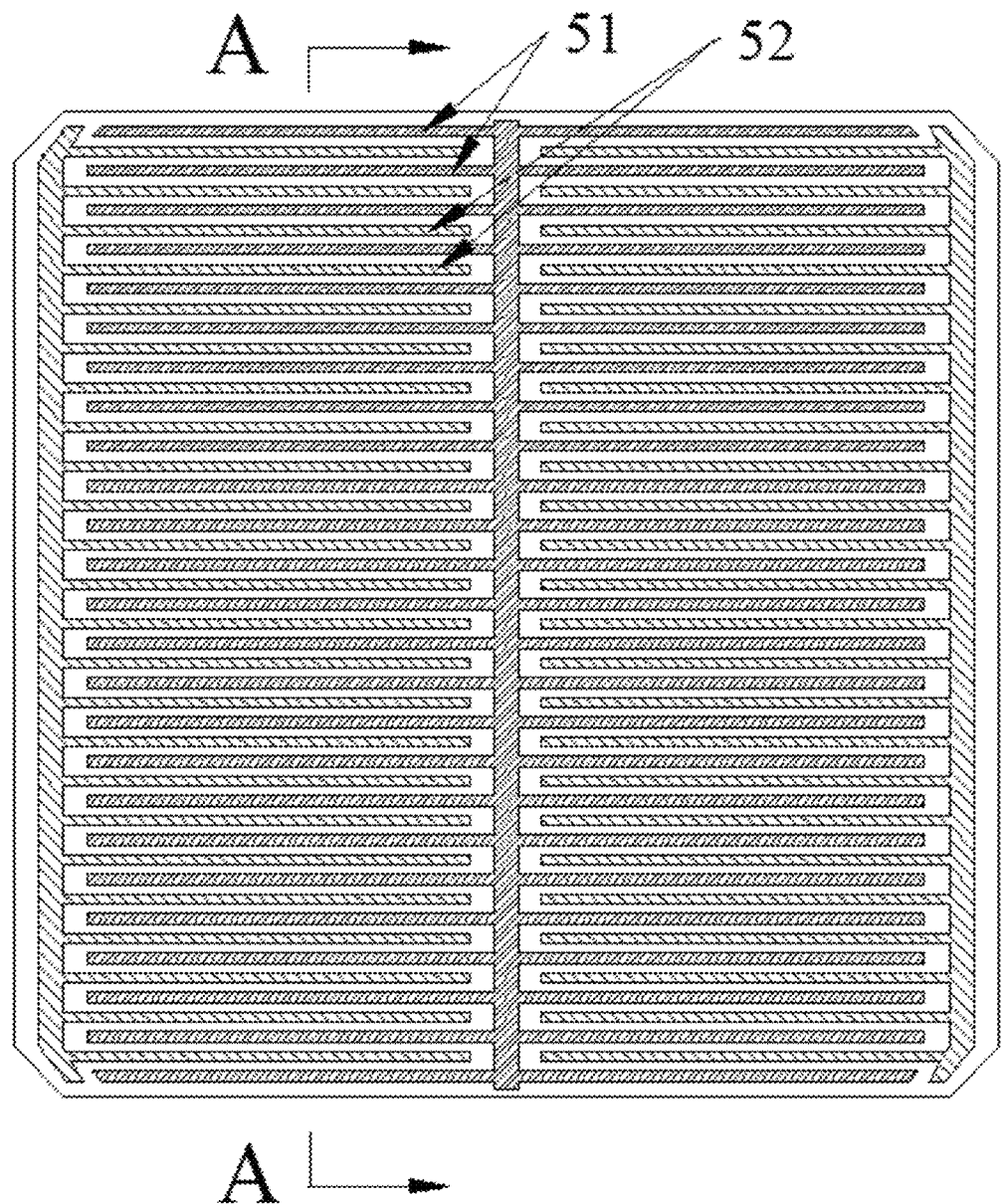
FIG. 2 is a top view of the hybrid passivation back contact cell according to one embodiment of the present disclosure.
Figure 3:
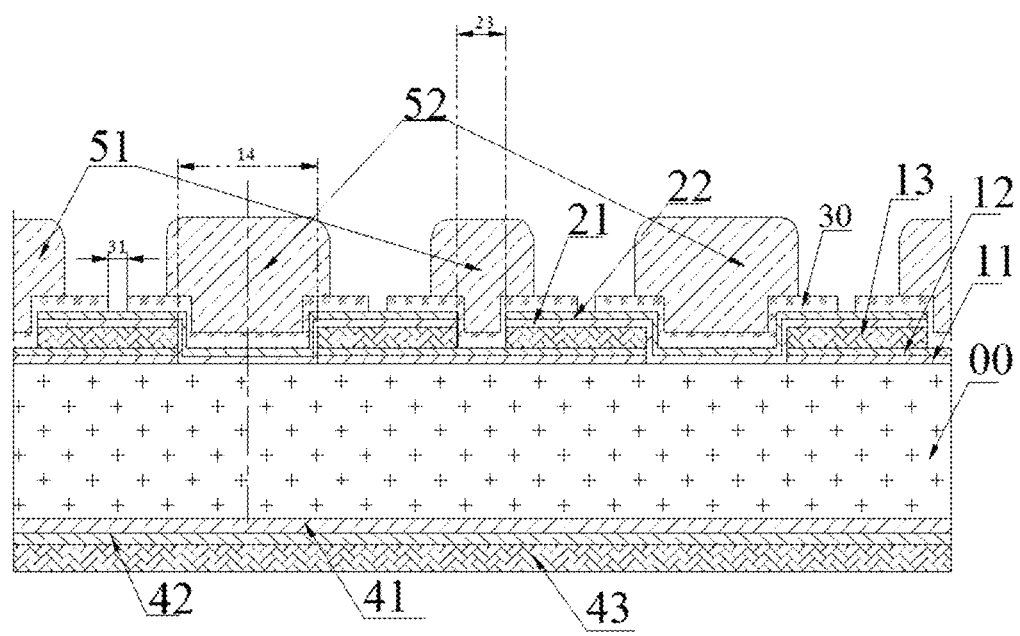
FIG. 3 is a sectional view taken along A-A of FIG. 2.
Figure 4A:
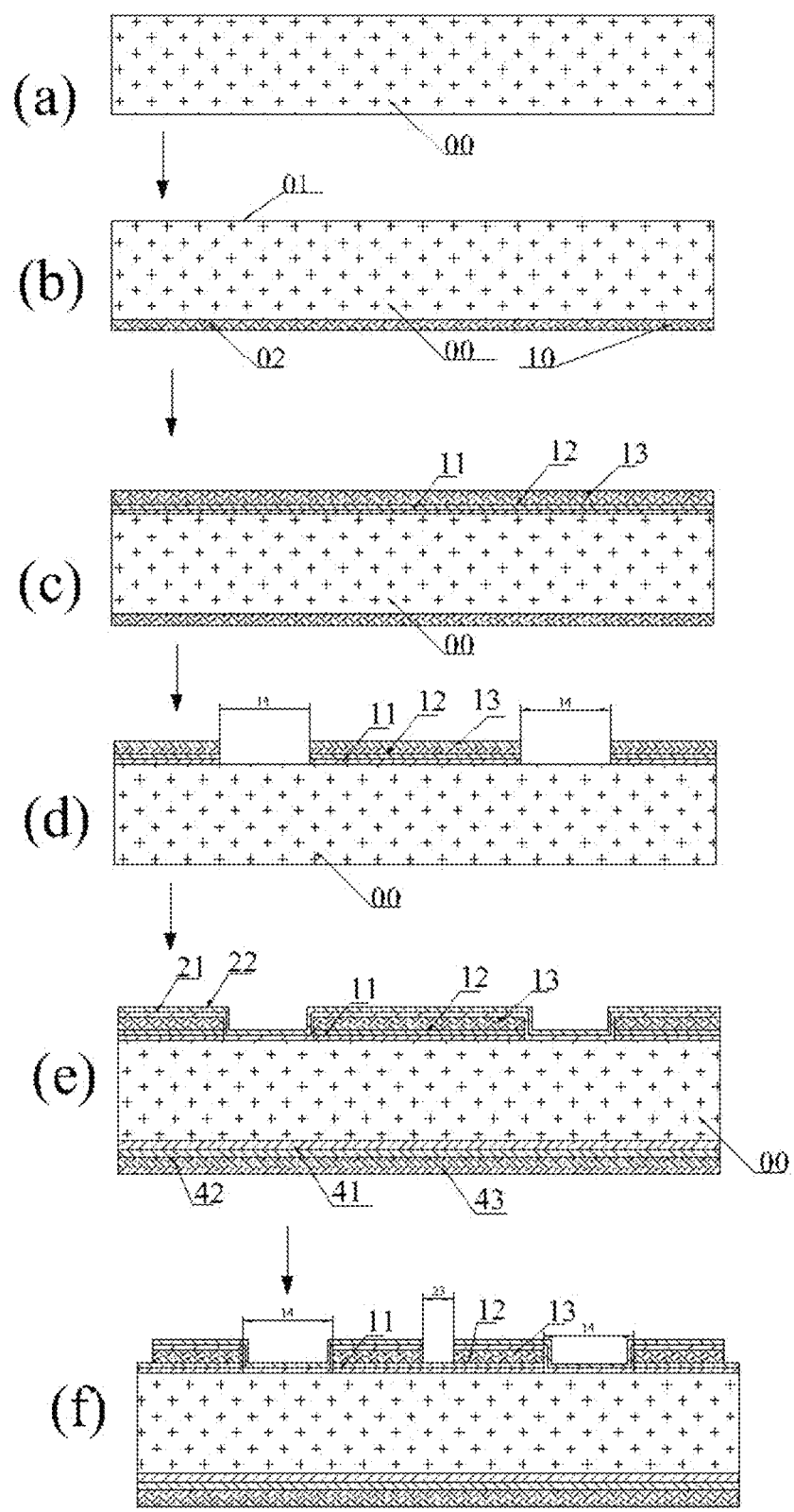
FIG. 4a is a flow chart of a process for fabricating a first semiconductor layer and a second semiconductor layer in the hybrid passivation back contact cell according to the present disclosure.
Figure 4B:
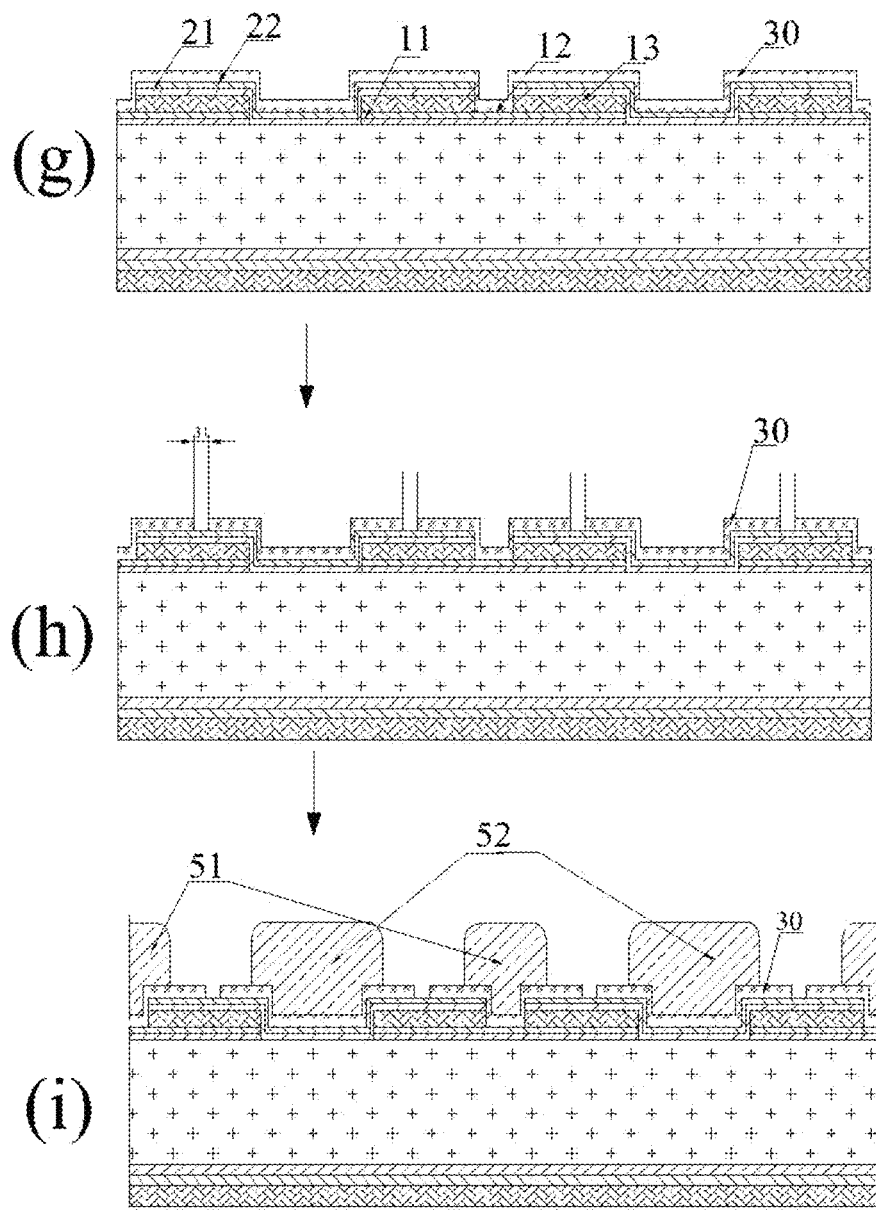

A hybrid passivation back contact cell as shown in FIGS. 2 and 3 was fabricated by the following steps as shown in FIGS. 4a and 4b.
- (a) Chemically texturing and cleaning an N-type doped Czochralski monocrystalline silicon wafer substrate to form an N-type doped silicon substrate 00 with a structure with two textured surfaces.
- (b) Plating a protective sacrificial layer 10 on a light receiving surface 02, and chemically etching a back surface 01 for polishing, so as to form an N-type doped silicon substrate 00 with a structure with the textured light receiving surface 02 and the polished back surface 01.
- (c) Then fabricating a first semiconductor layer on the back surface 01, and plating a dielectric insulation film 13 above the first semiconductor layer by using a PECVD method, wherein a process of fabricating the first semiconductor layer included: firstly, placing the N-type doped silicon substrate 00 in a furnace tube type apparatus, heating the N-type doped silicon substrate 00 to 600° C., introducing oxygen into the apparatus for oxidation for 10-30 min, and forming a tunneling oxide layer 11 on the back surface 01; and then depositing polycrystalline silicon by LPCVD, and then adding a diffusion source for diffusion to form an N-type doped silicon crystal layer 12, with a diffusion temperature being 850° C., a diffusion source being phosphorus oxychloride, and a diffusion time being 100 min.
- (d) Performing first laser ablation on the back surface 01 obtained in step (c), and removing part of the first semiconductor layer and the dielectric insulation film 13 on the first semiconductor layer at intervals in combination with a wet chemical etching mode, so as to expose the N-type doped silicon substrate, and form a hole 14, wherein a laser absorption amount $D_1$ of the to-be-removed first semiconductor layer was more than 70% of a total absorption amount of all the film layers, wherein condition of the first laser ablation was as follows: ultraviolet pulsed laser having a wavelength of about 355 nm with partially overlapped continuously scanning light spots was adopted, and a pulse width was 15 nanoseconds. The used laser formed circular light spots on the back surface 01, as shown in FIG. 5. The used laser was spatially shaped into flat-top laser.
- (e) Then, after cleaning, fabricating a second semiconductor layer on the back surface 01 by a PECVD full-area covering method, that is, sequentially forming an intrinsic silicon layer 21 and a P-type doped silicon layer 22, and sequentially fabricating a passivation film layer 41 (intrinsic amorphous silicon), a doped film layer 42 (N-type amorphous film layer) and an antireflective film layer 43 (silicon nitride) on the light receiving surface 02 by a PECVD method.
- (f) Performing second laser ablation on the back surface 01 obtained in step (e), wherein laser exposure ablation was performed twice to remove the second semiconductor layer, part of the dielectric insulation film 13 below the second semiconductor layer and part of the top N-type doped silicon crystal layer 12 at the bottom, and an opening 23 was formed without chemical etching. In the first laser exposure ablation, the laser absorption amount $D_{201}$ of the to-be-removed second semiconductor layer was more than 70% of the total absorption amount of all the film layers; in the second laser exposure ablation, the laser absorption amount $D_{202}$ of the to-be-removed underlying dielectric insulation film 13 and part of the top N-type doped silicon crystal layer at the bottom was more than 50% of the total absorption amount of all the film layers. Condition of the second laser ablation was as follows: continuous-hole-formation green pulsed laser with a wavelength of about 532 nm was adopted, and a pulse width was 20 picoseconds, thus avoiding a reduction of a power generation efficiency caused by laser damage. The light spots formed on the back surface by the used laser were rectangular, and the adjacent light spots were partially overlapped. The used laser was spatially shaped into rectangular flat-top laser to ensure that energy in a processed region tended to be consistent.
- (g) Fabricating a transparent conductive film 30 on the obtained back surface 01 in a full covering mode.
- (h) Performing third laser ablation on the transparent conductive film 30 on the back surface 01 to form an insulation groove 35, wherein parts of the transparent conductive film 30 on both sides of the insulation groove 35 were electrically insulated from each other, wherein a mode that continuous scanning light spots were partially overlapped was adopted in the third laser ablation, and the laser absorption amount $D_3$ of the transparent conductive film to be etched was more than 85% of the total absorption amount of all the film layers. Condition of the third laser ablation was as follows: pulsed laser having a laser wavelength of 355 nm was adopted, and a pulse width was 10 nanoseconds. The used laser formed circular light spots on the back surface 01.
- (i) By screen printing, forming a metalized pattern of a main grid line 52 electrode on a surface of the hole 14, forming a metalized pattern of a fine grid line 51 electrode perpendicular to a main grid line 52 on a surface of the opening 23, and forming a metalized pattern of a pad for welding, which was beneficial to realization of effective electric contact.

A thickness ratio of the tunneling oxide layer 11, the N-type doped silicon crystal layer 12 (N-type doped polycrystalline silicon), the intrinsic silicon layer 21 (intrinsic amorphous silicon), and the P-type doped silicon layer 22 (P-type doped amorphous silicon) was 1:88:2.9:4. A ratio of a surface doping index of the N-type doped silicon crystal layer 12 to a surface doping index of the P-type doped silicon layer 22 was 0.3:1, wherein the surface doping index was a ratio of an effective doping concentration of the corresponding doped layer to the thickness of the doped layer.

The resulting hybrid passivation back contact cell was tested for a short circuit current Isc, an open circuit voltage Voc, a filling factor FF, a conversion efficiency Eta, and yield and a material cost of this bath were measured, with results shown in Table 1.

Figure 7:
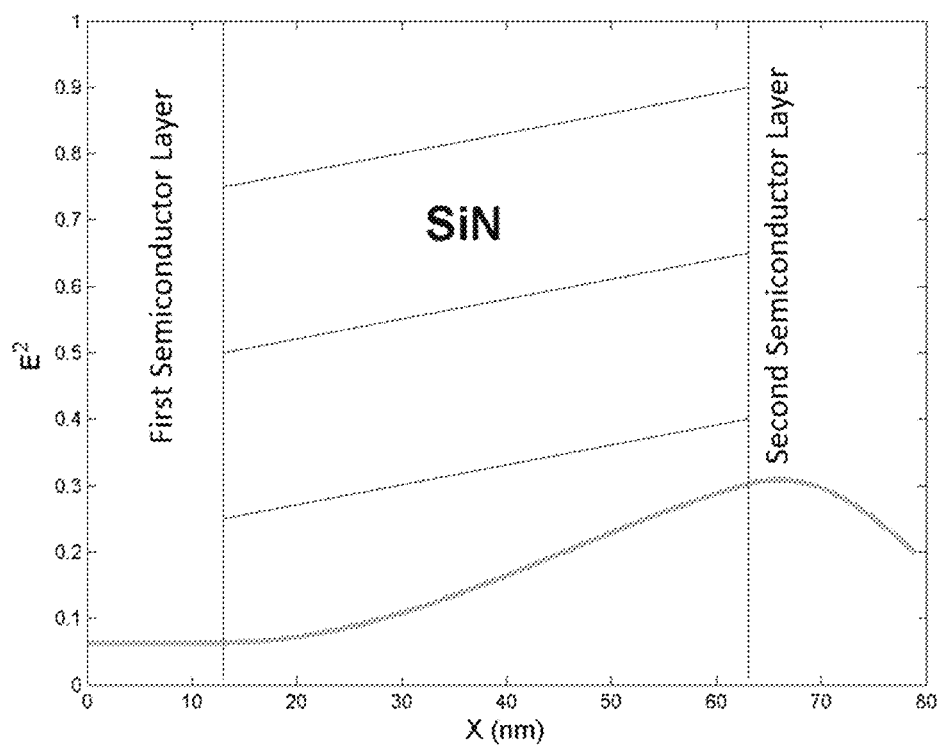
FIG. 7 is an $E^2$ (square value of electric field intensity) distribution graph of laser in the first semiconductor layer and the second semiconductor layer formed by emitting the laser with a wavelength of about 532 nm into the back surface of the cell in Example 1 of the present disclosure, in which X is a thickness with a back surface of a substrate as a starting zero point.

The back surface of the hybrid passivation back contact cell obtained in Example 1 was irradiated with laser having a wavelength of about 532 nm, and formed $E^2$ (square value of electric field intensity) distribution of the laser in the first semiconductor layer and the second semiconductor layer is shown in FIG. 7. As can be seen from FIG. 7, optical absorption sensed by the first semiconductor layer is 4-5 times or more that of an underlying layer due to an interference effect and can be adjusted correspondingly in order with the thickness of the dielectric insulation film 13, thus ensuring that the opening is effectively formed in the second semiconductor layer without a need for additional chemical smoothing correction.

Figure 8:
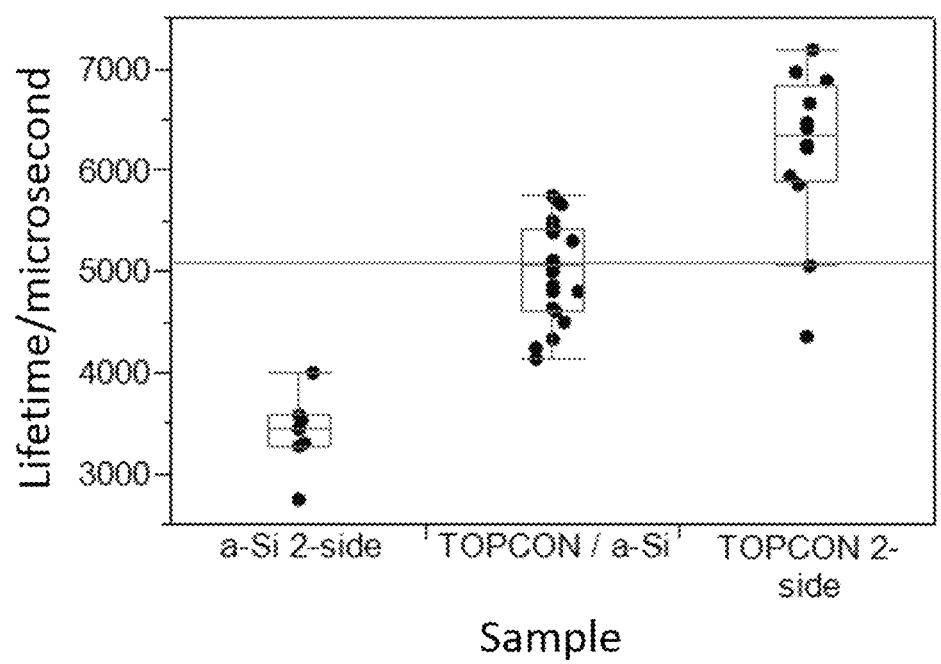
FIG. 8 is a comparative diagram of minority carrier lifetime of the hybrid passivation back contact cell according to Example 1 of the present disclosure, a TOPCON passivation method and a traditional heterojunction passivation method. In the drawing, for the sample "a-Si 2-side", heterojunction passivation is adopted for both surfaces of the substrate, the sample "TOPCON/a-Si" is the hybrid passivation back contact cell according to Example 1 of the present disclosure, and for the sample "TOPCON 2-side", TOPCON passivation is adopted for both surfaces of the substrate. The minority carrier lifetime is collected at a carrier density of $5e15/cm^3$.

A comparative diagram of minority carrier lifetime of the hybrid passivation back contact cell, a TOPCON passivation method and a traditional heterojunction passivation method is shown in FIG. 8. As can be seen from FIG. 8, a surface passivation ability of the N-type passivation TOPCON is equal to or stronger than the heterojunction thin film passivation ability in terms of passivation ability.

Example 2

Referring to the method of Example 1, the difference was that a conventional fabrication method was used instead of laser ablation, which specifically included following steps.

step (d): during the removal of the first semiconductor, smearing a paste etching material by screen printing, carrying out a sintering reaction at a medium temperature (80-120° C.) after crystal solidification, removing the first semiconductor layer fabricated by an amorphous silicon film plating mode, removing the dielectric insulation film 13 on the first semiconductor layer by a chemical etching mode, and then repeating multi-process cleaning to remove high-residue etching paste.

Step (f): selectively removing the second semiconductor layer by an etching paste printing mode, and removing the dielectric insulation film 13 thereunder by means of chemical etching, wherein a set temperature of the sintering reaction was higher and was 200° C. due to the P-type doping in the second semiconductor layer. Due to the high temperature, other surfaces of the cell were also corroded by migrating corrosive gas, and multiple protective ink layers were required to be applied to a front surface and a back surface.

Step (h): forming an insulation groove position to be provided with an insulation groove in a flowing mode by printing protective ink, and chemically etching the transparent conductive film in a full-cell soaking mode to ensure that the N-type electrode and the P-type electrode were not short-circuited.

Corresponding tests were carried out, results of which are shown in Table 1.

Example 3

Referring to the method of Example 1, the difference was that the thickness ratio of the intrinsic silicon layer and the tunneling oxide layer was 6:1. Corresponding tests were carried out, results of which are shown in Table 1.

Example 4

Referring to the method of Example 1, the difference was that the ratio of the surface doping index of the N-type doped silicon crystal layer to the surface doping index of the P-type doped silicon layer was 3:1. Corresponding tests were carried out, results of which are shown in Table 1.

Example 5

Referring to the method of Example 1, the difference was that the doped film layer 42 was an N-type oxygen-containing microcrystalline film layer. Corresponding tests were carried out, results of which are shown in Table 1.

Example 6

Referring to the method of Example 1, the difference was that the P-type doped silicon layer 22 included an incubation layer, a P-type oxygen-containing microcrystalline layer and a P-type oxygen-free microcrystalline layer, and the P-type oxygen-containing microcrystalline layer, the P-type oxygen-free microcrystalline layer and the incubation layer had a thickness ratio of 1:2.5:0.5. Corresponding tests were carried out, results of which are shown in Table 1.

Comparative Example 1

Referring to the method of Example 1, the difference was that the first semiconductor layer was made of intrinsic amorphous silicon and N-type doped amorphous silicon prepared at a low temperature, and the thickness ratio and the surface doping index of the layers were the same as those of Example 1; and for the fabrication or etching method thereof, reference was made to CN114068731A. Corresponding tests were carried out, results of which are shown in Table 1.

Comparative Example 2

In the comparative example, a N-type and P-type staggered structure with TOPCON passivation was adopted; specifically, the back contact cell included a crystalline silicon substrate (N-type doped silicon substrate), a light receiving surface thereof was sequentially provided with a tunneling oxide layer, a thin film silicon layer and a low-temperature-process anti-reflective film layer, a back light surface thereof was provided with a tunneling oxide layer, the tunneling oxide layer was provided with p-type and n-type heavily doped amorphous silicon layers arranged at intervals, and each of the p-type and n-type heavily doped amorphous silicon layers was sequentially provided with a transparent conductive thin film layer and a metal electrode layer, wherein thicknesses and effective doping concentrations of the crystalline silicon substrate, the tunneling oxide layer, and the p-type and n-type heavily doped amorphous silicon layers were the same as those of Example 1. For the fabrication method thereof, reference was made to CN110634961A. Corresponding tests were carried out, results of which are shown in Table 1.

TABLE 1

| Example number | Isc/KA | Voc/V | FF | Eta | Yield | Material cost/yuan/piece |
|---|---|---|---|---|---|---|
| Example 1 | 1 | 1 | 1 | 1 | 100% | 0.95 |
| Example 2 | 1 | 1 | 0.99 | 0.99 | 92% | 1.2 |
| Example 3 | 0.99 | 1 | 0.98 | 0.97 | 97% | 0.96 |
| Example 4 | 1 | 0.99 | 0.97 | 0.96 | 97% | 0.94 |
| Example 5 | 1.01 | 1 | 1 | 1.01 | 100% | 0.95 |
| Example 6 | 1 | 1.002 | 1.005 | 1.007 | 95% | 1.1 |
| Comparative Example 1 | 1 | 1 | 0.99 | 0.99 | 95% | 1.2 |
| Comparative Example 2 | 1.022 | 0.962 | 1 | 0.983 | 100% | 0.95 |

As can be seen from the above examples, comparative examples and Table 1, the short circuit current Isc, the open circuit voltage Voc, the filling factor FF, and the conversion efficiency Eta of the cell obtained in the examples of the present disclosure are all at high levels, and both high yield and a suitably low material cost can be considered. The comprehensive effect of the solution of the comparative examples cannot reach the effect level of the present disclosure.

As can be seen from Examples 1 and 2, the preferred solution of the fabrication method of laser ablation according to the present disclosure is more favorable for an improvement of the filling factor FF, the conversion efficiency Eta, and the yield. As can be seen from Example 1 and Examples 3 to 4, the preferred solution of the structures of the first semiconductor layer and the second semiconductor layer of the present disclosure is more favorable for the overall electrical conversion efficiency. As can be seen from Example 1 and Example 5, the preferred solution of the doped film layer of the present disclosure is more beneficial to an improvement of the short circuit current Isc and the conversion efficiency Eta. As can be seen from Examples 1 and 6, from the perspective of pursuing a better cell performance, compared with Example 1, the solution of Example 6 of the present disclosure is more favorable for an improvement of the open circuit voltage Voc, the filling factor FF, and the conversion efficiency Eta of the cell; and from the perspective of considering both the cost and the conversion efficiency, the preferred solution of Example 1 of the present disclosure is more favorable for a balance between the stability of a manufacturing cost and the conversion efficiency, and thus is most favorable for large-scale commercialization of the mass production of heterojunction back contact.

Test Example

Taking the hybrid passivation back contact cell of Example 1 as an example, on the premise that the dielectric insulation film thereof was made of 50-100 nm silicon nitride, laser with a wavelength of 532 nm was emitted into the back surface of the hybrid passivation back contact cell, and results of optical absorption amounts of the first semiconductor layer and the second semiconductor layer caused by formed pulsed laser and the relative selectivity therebetween are shown in table 2. The relative selectivity was characterized by a selection ratio, the higher the selection ratio is, the easier the removal of the upper second semiconductor layer without damaging the first semiconductor layer close to the substrate is. A calculation mode of the selection ratio was as follows: second semiconductor layer absorption amount/first semiconductor layer absorption amount.

TABLE 2

| | Thickness of dielectric insulation film SiN | | |
|---|---|---|---|
| Absorption amount | 50 nm | 70 nm | 100 nm |
| N-type doped silicon crystal layer/% | 1.39 | 1.06 | 1.16 |
| Other absorption of first semiconductor layer/% | 1.51 | 1.17 | 1.29 |
| Total absorption of first semiconductor layer/% | 2.90 | 2.23 | 2.45 |
| Intrinsic silicon layer/% | 9.52 | 7.48 | 4.31 |
| P-type doped silicon layer/% | 9.46 | 6.28 | 2.81 |
| Total absorption of second semiconductor layer/% | 18.98 | 13.76 | 7.12 |
| Selection ratio | 6.5 | 6.2 | 2.9 |

As can be seen from Table 2, as the thickness of the dielectric insulation film increases, the selection ratio gradually decreases, which indicates that the thickness of the dielectric insulation film has a significant influence on the light absorption of the first semiconductor layer and the second semiconductor layer, and an appropriate thickness of the dielectric insulation film can ensure that the upper second semiconductor layer can be more easily removed during laser ablation without damaging the first semiconductor layer close to the substrate.

The preferred embodiments of the present disclosure have been described in detail above, but the present disclosure is not limited thereto. Within the scope of the technical idea of the present disclosure, many simple modifications can be made to the technical solution of the present disclosure, including various technical features being combined in any other suitable way, and these simple modifications and combinations should also be regarded as the disclosure of the present disclosure, and all fall within the scope of the present disclosure.

What is claimed is:

1. A hybrid passivation back contact cell, comprising:
an N-type doped silicon substrate having a light receiving surface and a back surface, and a first semiconductor layer and a second semiconductor layer arranged on the back surface,
wherein the second semiconductor layer comprises an intrinsic silicon layer and a P-type doped silicon layer sequentially arranged in an outward direction perpendicular to the back surface,
wherein the P-type doped silicon layer covers all portions of the intrinsic silicon layer,
wherein the first semiconductor layer comprises a tunneling oxide layer and an N-type doped silicon crystal layer sequentially arranged in the outward direction perpendicular to the back surface,
wherein a ratio of a N-type surface doping index of the N-type doped silicon crystal layer to a P-type surface doping index of the P-type doped silicon layer is (0.07-1):1, and
wherein each of the N-type surface doping index and the P-type surface doping index is a corresponding ratio of an effective doping concentration of a corresponding doped layer to a thickness of the corresponding doped layer.

2. The hybrid passivation back contact cell according to claim 1, wherein the intrinsic silicon layer and the tunneling oxide layer have a thickness ratio of 1.2-11:1.

3. The hybrid passivation back contact cell according to claim 2, wherein the tunneling oxide layer, the N-type doped silicon crystal layer, the intrinsic silicon layer, and the P-type doped silicon layer have a thickness ratios of 1:11-300:1.2-11:3-50.

4. The hybrid passivation back contact cell according to claim 1, wherein the intrinsic silicon layer is made of intrinsic amorphous silicon, the P-type doped silicon layer is made of P-type doped amorphous silicon or P-type doped microcrystalline silicon, and the N-type doped silicon crystal layer is made of N-type doped polycrystalline silicon.

5. The hybrid passivation back contact cell according to claim 1, wherein the P-type doped silicon layer comprises an incubation layer, a P-type oxygen-containing microcrystalline layer and a P-type oxygen-free microcrystalline layer, and wherein the P-type oxygen-containing microcrystalline layer and the P-type oxygen-free microcrystalline layer have a thickness ratio of 1:0.25-7.

6. The hybrid passivation back contact cell according to claim 1,
wherein the N-type doped silicon substrate is formed by cutting a Czochralski single crystal or an ingot single crystal by a diamond wire or mortar;

wherein the light receiving surface of the N-type doped silicon substrate is a textured surface; and wherein the back surface is a polished surface.

7. The hybrid passivation back contact cell according to claim 1, further comprising:
   a dielectric insulation film provided on a surface of the first semiconductor layer,
      wherein the first semiconductor layer and the dielectric insulation film provided thereon are arranged at intervals along a direction parallel to the back surface as a whole,
      wherein the second semiconductor layer is provided on a surface of the dielectric insulation film and covers a surface of the intervals, and
      wherein an opening for exposing the first semiconductor layer is formed in the second semiconductor layer between adjacent intervals;
   a transparent conductive film provided on a surface of the second semiconductor layer and a surface of the first semiconductor layer exposed at the opening,
      wherein an insulation groove for exposing the second semiconductor layer is formed on the transparent conductive film between adjacent interval and the opening; and
   a passivation film layer, a doped film layer and an anti-reflective film layer are arranged on a surface of the light receiving surface and sequentially arranged along a second outward direction perpendicular to the light receiving surface.

8. The hybrid passivation back contact cell according to claim 7, wherein the passivation film layer is made of intrinsic amorphous silicon;
   the doped film layer is an N-type amorphous film layer or an N-type oxygen-containing microcrystalline film layer; and
   the anti-reflective film layer is made of at least one of silicon nitride, silicon dioxide, silicon oxide and silicon oxynitride.

9. A fabrication method of the hybrid passivation back contact cell according to claim 1, comprising:
   providing the N-type doped silicon substrate;
   sequentially plating the first semiconductor layer and a dielectric insulation film on the back surface of the N-type doped silicon substrate,
      wherein the first semiconductor layer comprises the tunneling oxide layer and the N-type doped silicon crystal layer;
   etching holes to remove the dielectric insulation film and the first semiconductor layer from the back surface at intervals, and then cleaning to obtain the first semiconductor layer and the dielectric insulation film arranged at the intervals;
   forming the second semiconductor layer in a full cover mode on the back surface having the first semiconductor layer and the dielectric insulation film arranged at the intervals,
      wherein the second semiconductor layer comprises the intrinsic silicon layer and the P-type doped silicon layer, and
      wherein a second conductive region is formed by the second semiconductor layer provided within the holes;
   etching an opening on the back surface of the N-type doped silicon substrate to expose the first semiconductor layer on a part of the second semiconductor layer between adjacent intervals, and then cleaning to form a first conductive region,
      wherein the first conductive region and the second conductive region are alternately arranged;
   depositing a transparent conductive film on the back surface of the N-type doped silicon substrate after etching the opening and etching an insulation groove on the transparent conductive film between the opening and a corresponding hole such that a first electrode is formed within the corresponding hole and a second electrode is formed within the opening; and
   sequentially forming a passivation film layer, a doped film layer and an anti-reflective film layer on the light receiving surface opposite the back surface of the N-type doped silicon substrate.

10. The fabrication method according to claim 9, wherein the opening is etched by laser ablation in conjunction with optional chemical etching such that the first semiconductor layer, the second semiconductor layer and the transparent conductive film are removed by the laser ablation, and the dielectric insulation film is removed by the laser ablation or chemical etching.

11. The fabrication method according to claim 10, wherein etching holes is performed by removing the first semiconductor layer by a first laser ablation mode in which continuously scanning light spots are partially overlapped such that a laser absorption amount $D_1$ of the first semiconductor layer is more than 70% of a total absorption amount of all film layers.

12. The fabrication method according to claim 11, wherein conditions for the first laser ablation mode comprises:
   a pulse laser is adopted, and a pulse width is less than 20 nanoseconds;
   a light spot formed on the back surface by a laser is circular, elliptical or rectangular; and
   the laser is spatially shaped into square, circular or elliptical flat-top laser.

13. The fabrication method according to claim 10, wherein removing the second semiconductor layer by etching of the opening is performed in a discontinuous-hole-formation mode or a continuous-hole-formation second laser ablation mode, wherein:
   the discontinuous-hole-formation mode comprises forming non-overlapping light spots on the second semiconductor layer located on a top layer such that a first laser absorption amount $D_2$ of the second semiconductor layer is more than 70% of a total absorption amount of all film layers; and
   the continuous-hole-formation second laser ablation mode comprises:
      first laser exposure ablation of adjacent, partially overlapping light spots on the second semiconductor layer located on the top layer to remove the second semiconductor layer such that a second laser absorption amount $D_{201}$ required for removing a corresponding layer is more than 70% of the total absorption amount of all the film layers; and
      a second laser exposure ablation within an overlap region of the adjacent, partially overlapping light spots to remove an underlying dielectric insulation film and a portion of a top N-type doped silicon crystal layer at a bottom such that a third laser absorption amount $D_{202}$ required for removing the corresponding layer is more than 50% of the total absorption amount of all the film layers.

14. The fabrication method according to claim 13, wherein conditions for the second laser exposure ablation comprises:

a pulse laser having a pulse width is less than 20 nanoseconds;
a light spot formed on the back surface by a laser is circular, elliptical or rectangular; and
the laser is spatially shaped into rectangular, circular or elliptical flat-top laser.

15. The fabrication method according to claim 10, wherein the insulation groove is etched in a third laser ablation mode in which continuously scanning light spots are partially overlapped, and a fourth laser absorption amount $D_3$ of the transparent conductive film and the second semiconductor layer overlapped therewith is more than 70% of a total absorption amount of all film layers.

16. The fabrication method according to claim 15, wherein conditions for the third laser ablation mode comprises:
a pulse laser having a pulse width is less than 100 nanoseconds; and
a light spot formed on the back surface by a laser is circular, elliptical or rectangular.

* * * * *